United States Patent [19]
Hoshita et al.

[11] Patent Number: 5,276,649
[45] Date of Patent: Jan. 4, 1994

[54] DYNAMIC-TYPE SEMICONDUCTOR MEMORY DEVICE HAVING STAGGERED ACTIVATION OF COLUMN GROUPS

[75] Inventors: Tetsushi Hoshita; Youichi Tobita; Kenji Tokami, all of Hyogo, Japan

[73] Assignee: Mitsubishi Denki Kabushiki Kaisha, Tokyo, Japan

[21] Appl. No.: 746,092

[22] Filed: Aug. 12, 1991

Related U.S. Application Data

[63] Continuation of Ser. No. 492,455, Mar. 13, 1990, abandoned.

[30] Foreign Application Priority Data

Mar. 16, 1989 [JP] Japan .................. 1-66603
Dec. 26, 1989 [JP] Japan .................. 1-341428
Jan. 31, 1990 [JP] Japan .................. 2-22847

[51] Int. Cl.⁵ .................. G11C 7/02; G11C 8/00
[52] U.S. Cl. .................. 365/206; 365/230.03; 365/230.04; 365/230.08; 365/233
[58] Field of Search .................. 365/63, 227, 194, 205, 365/206, 207, 208, 233, 230.03, 230.04, 230.06, 230.08

[56] References Cited

U.S. PATENT DOCUMENTS

| | | | |
|---|---|---|---|
| 3,942,164 | 3/1976 | Dunn | 365/63 |
| 4,222,112 | 9/1990 | Clemons et al. | |
| 4,556,961 | 12/1985 | Iwahashi et al. | 365/227 |
| 4,586,171 | 4/1986 | Fujishima | 365/205 |
| 4,635,234 | 1/1987 | Yamaguchi | 365/227 |
| 4,803,664 | 2/1989 | Itoh | 365/63 X |
| 4,839,868 | 6/1989 | Sato et al. | 365/233 |
| 4,912,678 | 3/1990 | Mashiko | 365/227 |
| 4,916,671 | 4/1990 | Ichiguchi | 365/233 |

FOREIGN PATENT DOCUMENTS 0071245 2/1983 European Pat. Off. .
0167281 1/1986 European Pat. Off. .
60-254489 12/1985 Japan .
61-20297 1/1986 Japan .
62-51096 3/1987 Japan .

OTHER PUBLICATIONS

Aoki et al., "An Experimental 16 Mb Dram with Transposed Data-Line Structure", Intl Solid State Circuits Conference, Feb. 1988, pp. 250-251, 391-392.
Kimura, et al., "A 65-ns 4-Mbit CMOS DRAM with a Twisted Driveline Sense Amplifier", *IEEE Journal of Solid-State Cricuits*, vol. SC-22, No. 5, Oct. 1987, pp. 651-656.

*Primary Examiner*—Joseph L. Dixon
*Assistant Examiner*—Michael A. Whitfield
*Attorney, Agent, or Firm*—Lowe, Price, LeBlanc & Becker

[57] ABSTRACT

A semiconductor memory device includes a memory cell array block (1; MB1 to MB16) having a first column group (area I) and a second column group (area II). The device also includes sense amplifiers (10-1, 10-2, 10-3 . . . ) provided for each column to detect and amplify a read-out voltage on associated columns. The device further includes a control circuit (20) for activating the sense amplifiers for the first column group and the sense amplifiers for the second column group at different timings to reduce peak current in sensing operation. The control circuit operates in response to a column designating signal to activate first the sense amplifiers for the column group including a column connecting thereto a selected memory cell. The column designating signal includes an externally applied column address bit. The column address bit is supplied to the device simultaneous with row address bits in an address multiplexing memory device. The first column group (BL0, $\overline{BL0}$, BL2, $\overline{BL2}$) includes a plurality of bit line pairs having at least one twisted portions. The second column group (BL1, $\overline{BL1}$) includes a plurality of bit line pairs having no or one or more twisted portion. Bit line pairs of the first column group and bit line pairs of the second column group are arranged alternately.

16 Claims, 18 Drawing Sheets

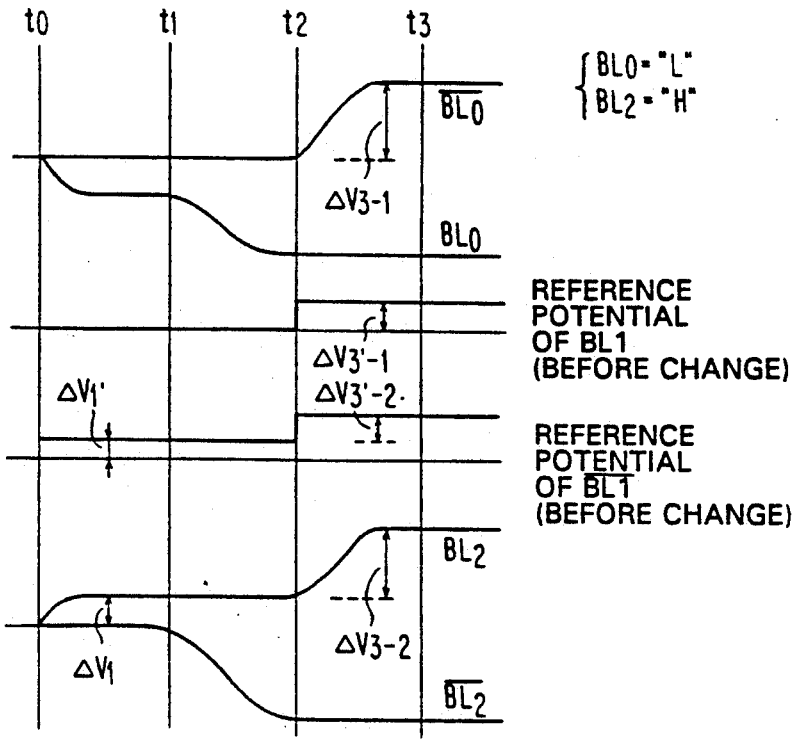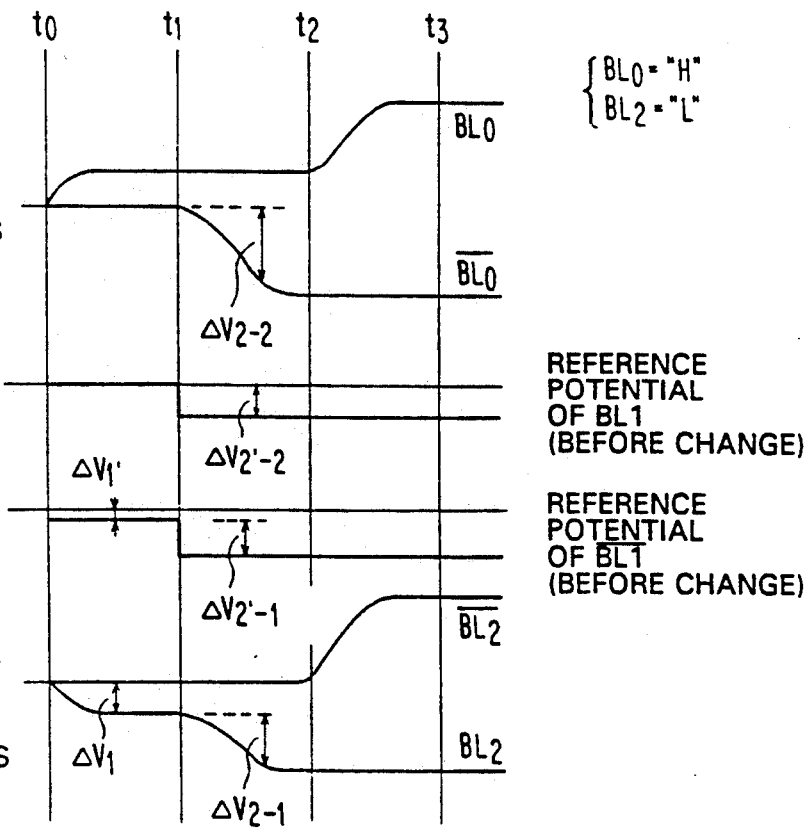

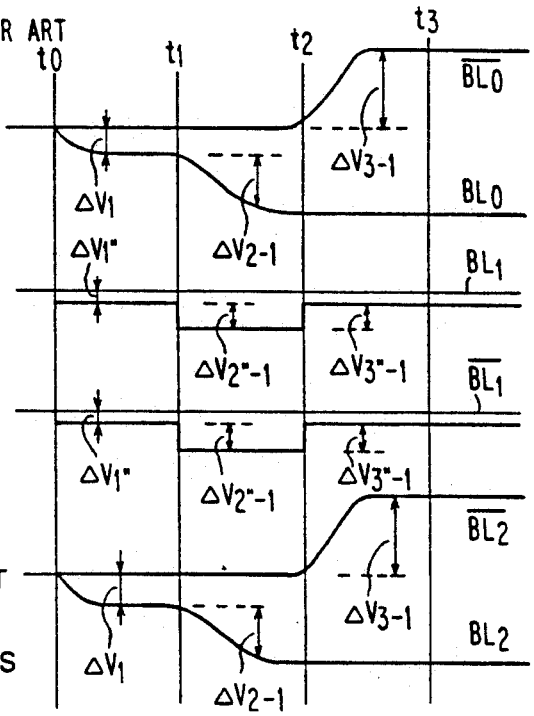
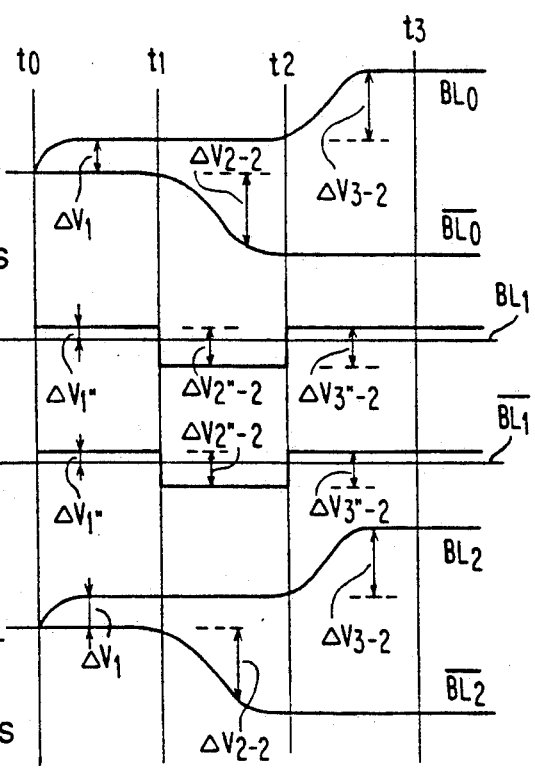

DYNAMIC-TYPE SEMICONDUCTOR MEMORY DEVICE HAVING STAGGERED ACTIVATION OF COLUMN GROUPS

This application is a continuation of application Ser. No. 07/492,455 filed Mar. 13, 1990 now abandoned.

BACKGROUND OF THE INVENTION

1. Field of the Invention

This invention relates generally to dynamic-type semiconductor memory devices, and more particularly, to an improvement of a scheme for driving a sense amplifier in a dynamic random access memory having a twisted bit line arrangement.

2. Description of the Background Art

As one of semiconductor memory devices, a dynamic-type random access memory (hereinafter, referred to as DRAM) is known. FIG. 1 shows an example of an entire structure of a conventional DRAM.

Referring to FIG. 1, the DRAM includes a memory cell array 1 in which a plurality of memory cells (not shown in FIG. 1) are arranged in a matrix. In order to select one memory cell (in case of 1 bit configuration) of the memory cell array 1, provided are an address buffer 2 for receiving an address A applied from an exterior to generate an internal row address RA and an internal column address CA, an X decoder 3 for decoding the internal row address RA from the address buffer 2 to select one corresponding row in the memory cell array 1, and a Y decoder 4 for decoding the internal column address CA from the address buffer 2 to select one column of the memory cell array 1.

In order to transfer data between a selected memory cell and the exterior of DRAM, provided are a sense amplifier which is activated in response to a sense amplifier activating signal $\phi 0$ from a sense amplifier activating signal generator 8, for sensing data of memory cells in one row selected by the X decoder 3 for amplification, and an I/O gate for selecting one column in the memory cell array 1 in response to a signal from the Y decoder 4 to connect the selected one to the exterior to the memory. FIG. 1 shows the sense amplifier and the I/O gate as included in one block 7.

In order to define operation timing of DRAM, provided are a RAS buffer 5 which receives a row address strobe signal $\overline{RAS}$ applied from the exterior for generating an internal signal to apply the same to the address buffer 2, the X decoder 3 and the sense amplifier activating signal generator 8, and a CAS buffer 6 which generates an internal control signal (a signal for controlling column selecting operation) in response to the column address strobe signal $\overline{CAS}$ for applying the same to the address buffer 2 and the Y decoder 4.

The address A from the exterior to the address buffer 2 has a row address and a column address time division multiplexed. The address buffer 2 generates an internal row address RA and an internal column address CA after accepting the internal address A as a row address and a column address in response to each internal control signal from the RAS buffer 5 and the CAS buffer 6.

FIG. 2 shows an example of a detailed structure of the memory cell array 1, the sense amplifier and I/O gate block 7 shown in FIG. 1.

Referring to FIG. 2, memory cells MC are arranged in matrix of rows and columns. Bit lines each for connecting a column of the memory cell array 1 constitute a folded bit line scheme wherein two bit lines are disposed in pair. More specifically, bit lines BL0 and $\overline{BL0}$ connect one column of the memory cell array, and respective bit lines $\overline{BL1}$, BL1 and BL2, $\overline{BL2}$, and BLm, $\overline{BLm}$ select one column of the memory cell array.

Word lines WL1, WL2, ..., each connecting one row of the memory cell array 1 are provided so as to intersect with each of bit lines BL0 - BLm.

Sense amplifiers 10 - 1 ~ 10 - n are provided on each of bit line pairs BL0, $\overline{BL0}$, ..., and BLm, $\overline{BLm}$, which are activated in response to a sense amplifier activating signal $\phi 0$ for sensing potentials of a corresponding bit line pair for amplification.

Precharging-equalizing circuits 15 - 1 ~ 15 - n are provided on each of bit line pairs BL0, $\overline{BL0}$, ... and BLm, $\overline{BLm}$ for precharging and equalizing each bit line pair to a predetermined potential (usually, half an operation power supply potential Vcc/2).

Furthermore, each of column selecting switches T0, T0', T1, T1', T2, T2', ..., Tm, Tm' is respectively provided corresponding to each bit line for connecting one column of the memory cell array 1 to data input-/output buses I/O, $\overline{I/O}$ in response to a column selecting signal from the Y decoder 4.

A memory cell MC is disposed at an intersection of each word line and one bit line of a bit line pair.

Parasitic capacitance $C_M$ inevitably exists between adjacent bit line pairs. The parasitic capacitance $C_M$ becomes large as a pitch or space between bit lines is made smaller concomitantly with the high integration of DRAM.

Now, brief description of operation will be made, taking an example of that in data reading. Initially, DRAM is in a stand-by state, and a row address strobe signal $\overline{RAS}$ is at "H" level. Accordingly, each of precharging/equalizing circuits 15 - 1 ~ 15 - n is in active state to precharge a corresponding bit line pair to a predetermined precharge potential Vp and hold the same.

When the row address strobe signal $\overline{RAS}$ drops to the "L" level, a memory cycle starts, thereby causing the address buffer 2 to accept an external address A for applying as an internal row address RA to the X decoder 3. The X decoder 3 decodes the internal row address RA and selects a single word line (e.g. a word line WL1) in the memory cell array 1, so that stored information in the memory cells MC connected to the selected word line (WL 1) is transferred onto a corresponding bit line. Then, each of the sense amplifiers 10 - 1 ~ 10 - n is activated by the sense amplifier activating signal $\phi 0$ from the sense amplifier activating signal generator 8, so that potentials on each bit line pair are sensed to be differentially amplified. Then, in response to an internal control signal from the CAS buffer 6, the address buffer 2 generates an internal column address CA to be applied to the Y decoder 4. The Y decoder 4 decodes the internal column address CA, and applies a column selecting signal to transfer gates T0 - Tm' for selecting a corresponding column, so that a pair of column selecting switches enters an on state and the selected bit line pair is connected to the data input/output buses I/O and $\overline{I/O}$, and then the selected memory cell data is read out to the exterior.

Data reading is performed in the above operation, wherein each of sense amplifiers 10 - 1 ~ 10 - n (hereinafter, as a representative, a sense amplifier is shown as a reference numeral 10) differentially amplifies a very small potential difference on a corresponding bit line pair. If a DRAM is more integrated, a parasitic capacitance $C_M$ between bit line pairs becomes large, so that a read potential between adjacent bit lines affects each other by means of capacitive coupling. Therefore, a problem arises that the sense amplifier 10 can not correctly sense and amplify a potential difference between a corresponding bit line pair. The situation of this will be explained in more detail in the following.

FIGS. 3A to 3D show change of a potential of each bit line pair during the operation of a sense amplifier. FIGS. 3A to 3D also show effects on reference potentials of a bit line pair BL1 and $\overline{BL1}$ exerted by bit line pairs BL0, $\overline{BL0}$ and BL2, $\overline{BL2}$. In the following, referring to FIGS. 3A to 3D, potential changes of bit lines due to capacitive coupling between adjacent bit line pairs at the time of operation of a sense amplifier will be described.

First, referring to FIG. 3A, an operation will be described wherein potentials of the logical low ("L") level are read out onto both of a bit line BL0 and a bit line BL2. When a potential of a selected word line (for example, a word line WL1 in FIG. 2) rises at the time of t0, information of a memory cell MC connected to the selected word line is transferred to the bit lines BL0 and BL2. At this time, the potentials of the bit lines $\overline{BL0}$ and $\overline{BL2}$ do not deviate and remain at the reference potential. Accordingly, a potential of a bit line $\overline{BL1}$ adjacent to the bit line $\overline{BL0}$ does not change and remains at the precharge potential $V_p$. On the other hand, the potential change $\Delta V1$ of the bit line BL2 is transferred to a bit line BL1 adjacent to the bit line BL2 by means of capacitive coupling, so that the reference potential of the $\overline{BL1}$ drops by $\Delta V1'$. At the time t1, a sense amplifier 10 is activated, thereby starting discharging a bit line of a lower potential of a bit line pair, so that the potential change $\Delta V2$-1 of the bit line BL2 is transferred to the bit line $\overline{BL1}$ by means of capacitive coupling and the reference potential (precharge potential) of the bit line $\overline{BL1}$ further drops by $\Delta V2'$- 1. When the sense amplifier further operates at the time t2, and bit lines of higher potential are charged to the operation power supply potential Vcc level, the potentials of the bit lines $\overline{BL0}$ and $\overline{BL2}$ rise to the power supply potential Vcc. Accordingly, the potential of the bit line BL1 rises by means of capacitive coupling by $\Delta V3'$-1 according to the potential change $\Delta V3'$- 1 of the bit line BL0.

Referring to FIG. 3B, described is a deviation of the reference potentials (precharge potential) of bit lines BL1 and $\overline{BL1}$ when potentials of the logical high "H" level are read out onto the bit lines BL0, BL2. First, when a potential of a selected word line rises at the time t0, data of respective memory cells connected to the selected word line are transferred to the bit lines BL0 and BL2, thereby causing the potentials of the bit lines BL0 and BL2 to rise by $\Delta V1$. Due to the potential rise $\Delta V1$ of the bit line BL2, a potential of the bit line $\overline{BL1}$ rises by $\Delta V1'$ by means of capacitive coupling. When the sense amplifier 10 is activated at the time t1, bit lines of lower potentials are discharged to the ground potential, thereby causing a potential of the bit line BL0 to drop to 0V, and causing the potential drop to the bit line BL1 by means of capacitive coupling, so that a potential of the bit line BL1 drops by $\Delta V2'$- 2. When at the time t2, a further operation of the sense amplifier causes bit line potentials of higher potential to rise to the power supply potential Vcc level, the potentials of the bit lines BL0 and BL2 further rise by $\Delta V3$ - 2. The potential rise $\Delta V3$ - 2 of the bit line BL2 is transferred to the bit line BL1 by means of capacitive coupling, so that the reference voltage of the bit line BL1 further rises by $\Delta V3'$- 2.

With reference to FIG. 3C, described is an operation wherein a potential of the "L" level is transferred to the bit line BL0 and a potential of the "H" level is transferred to the bit line BL2. At the time t0, when a potential of a selected word line rises, a potential of the bit line BL2 rises by $\Delta V1$, while a potential of the bit line BL0 drops by $\Delta V1$. The potential drop $\Delta V1$ of the bit line BL2 is transferred to the bit line BL1 by means of capacitive coupling, so that the reference potential of the bit line $\overline{BL1}$ rises by $\Delta V1'$. At the time t1, when the sense amplifier 10 is activated, bit lines of lower potential are discharged. At this time, since bit lines to be discharged are bit lines BL0 and $\overline{BL2}$, the potentials do not rise due to capacitive coupling to the bit lines BL1 and $\overline{BL1}$, and reference potentials of the bit lines BL1 and $\overline{BL1}$ remain the same as that of the time t1. when at the time t2, a further operation of the sense amplifier causes bit lines of higher potential to charge, a potential of the $\overline{BL0}$ rises by $\Delta V3$ - 1, and the potential of the bit line BL2 rises by $\Delta V3$ -2. As a result, the reference voltage of the bit line BL1 rises by $\Delta V3'$-1, while the reference potential of the bit line BL1 rises by $\Delta V3'$- 2.

Operation will be described with reference to the FIG. 3D wherein a potential of the "H" level is transferred to the bit line BL0 and a potential of the "0" level to the bit line BL2. At the time t0, when a selected word line is activated, a read potential $\Delta V1$ is transferred to the bit line BL0 and BL2. As a result, the reference potential of the bit line $\overline{BL1}$ drops by $\Delta V1'$. At the time t1, when the sense amplifier is activated, the bit lines $\overline{BL0}$ and BL2 are discharged to the ground potential. The potential drops $\Delta V2$ - 1 of the bit line BL2 is transferred to the bit line $\overline{BL1}$ by means of capacitive coupling, thereby causing the reference potential of the bit line $\overline{BL1}$ to further drop by $\Delta V2'$-2. The potential drop $\Delta V2'$-2 of the bit line $\overline{BL0}$ is transferred to the bit line BL1 by means of capacitive coupling, thereby causing the reference potential of the bit line BL1 to drop by $\Delta V2'$- 2. At the time t2, operation of the sense amplifier causes potentials of the bit lines BL0 and $\overline{BL2}$ of higher potential to start rising up to the power supply potential Vcc level. The potential rise of the bit lines BL0 and BL2 after the time t2 does not affect the potentials of the bit lines BL1 and $\overline{BL1}$.

As described in the foregoing, as the degree of integration of a semiconductor memory device DRAM is increased, a space between bit lines becomes narrower, and capacitance value of parasitic capacitance $C_M$ becomes larger. In this case, if potential changes caused by a coupling capacitance between adjacent bit lines are in the same phase, adverse effect on a sensing operation can be avoided, but when a noise occurs in the opposite phase, correct data reading can not be performed. More specifically, since the sense amplifier differentially amplifies a potential difference of a bit line pair, if noise of the same phase appears on a bit line pair, it is possible to cancel that noise and detect correctly the potential of the bit line pair. However, as shown in FIG. 3A and FIG. 3B, if noise of opposite phase occurs on a bit line pair, sometimes it will be impossible to read data correctly due to reduction in a potential difference of a bit line pair or due to inverse of readout data, caused by the noise.

A twisted bit line arrangement as shown in FIG. 4 is proposed in order to prevent operation of erroneous data reading due to capacitive coupling noise in such a highly integrated DRAM as the above. In FIG. 4, although the same reference numerals are given to the corresponding portions in FIG. 2, a bit line pair having crossing portion in the central portion is disposed every other pair. More specifically, while in FIG. 4, a bit line pair BL1 and $\overline{BL1}$, and bit line pair BLm and $\overline{BLm}$ are non-twisted bit line pair without crossing portion, bit line pair BL0 and $\overline{BL0}$, and bit line pair BL2 and $\overline{BL2}$ construct a twisted bit line pair arrangement having crossing portion in the center. In this case, for example, value of coupling capacitance of the bit line BL1 is reduced due to capacitive coupling to the respective bit lines BL0 and $\overline{BL0}$ through coupling capacitance $C_M/2$, and noise by means of the capacitive coupling to the adjacent bit lines BL0 and $\overline{BL0}$ becomes opposite phase, while noise of the same phase is transferred from the bit line BL1 to bit line BL0 and $\overline{BL0}$, thereby intending to reduce noise through coupling capacitance. FIGS. 5A to 5D show a diagram illustrating potential change in sensing operation of DRAM of a twisted bit line arrangement shown in FIG. 4.

FIG. 5A shows changes of reference potentials of the bit lines BL1 and $\overline{BL1}$ when potentials of the "L" level are transferred to the bit lines BL0 and BL2, FIG. 5B shows changes of reference potentials of the bit lines BL1 and $\overline{BL1}$ when potentials of the "H" level are transferred to the bit lines BL0 and BL2, FIG. 5C shows changes of reference potentials of the bit lines BL1 and $\overline{BL1}$ when potentials of the "H" level are transferred to the bit line BL2, and FIG. 5D shows changes of reference potentials of the bit lines BL1 and $\overline{BL1}$ when a potential of the "H" level is transferred to the bit line BL0 and that of the "L" level to the bit line BL2.

As shown in FIGS. 5A to 5D, all the potential changes of the bit lines $\Delta V2'- 2$, and $\Delta V3''- 2$ caused by capacitive coupling of adjacent bit line pairs occur in the same phase, and the amount of potential changes due to capacitive coupling is smaller than that in a non-twisted bit line structure. Accordingly, even if DRAM is more highly integrated and a pitch between bit lines is made smaller, it is possible to reduce noise caused by capacitive coupling and to make noise through capacitive coupling into the same phase on each bit line pair by employing the above twisted bit line structure, so that it will be possible to prevent erroneous detection of data in the sensing operation.

As in the foregoing, in a highly integrated DRAM, a twisted bit line structure makes it possible to reduce the amount of potential changes of bit lines caused by capacitive coupling between adjacent bit line pairs and to make capacitive coupling noise into noise of the same phase, and thus erroneous reading of data can be prevented. However, as DRAM is more highly integrated to have larger capacity, the number of memory cells connected to a single word line is increased. More specifically, for example, in the case of DRAM of 1M bit, 1024 memory cells are connected to a single word line. Since a single sense amplifier is provided to a single column, 1024 sense amplifiers are needed in the case of DRAM of 1M bit. In this case, since 1024 sense amplifiers are all to be operated simultaneously, potentials of the bit lines are charged or discharged through the sense amplifiers. As a result, peak current flowing through sense amplifiers in operation is increased, so that a large current leakage flows into a substrate to generate substrate current (hole current caused by impact ion and the like), and substrate potential deviates, resulting in malfunction of any circuit of DRAM in some case.

More specifically, a constant bias potential is usually provided to a substrate, so that a threshold voltage of MOSFET (insulated gate type field effect transistor) formed on a semiconductor substrate is stabilized, parasitic capacitance (junction capacitance) is reduced, and occurrence of parasitic FET caused between interconnection lines and the substrate is prevented, thereby stabilizing operation of each circuit. However, as in the foregoing, if many sense amplifiers operate simultaneously and large peak current flows through a substrate, not only the operation power supply potential deviates but also potential of the substrate deviates due to hole current flowing into the substrate, thereby causing malfunction of each circuit and making the correct data reading impossible.

Reduction of peak current has been tried by dividing a memory cell array into blocks, activating only a block comprising a selected memory cell, and operating only sense amplifiers included in the activated block. However, even in this scheme, the more the memory cells included in one block, the more the sense amplifiers operate simultaneously, which results in a large peak current flow.

SUMMARY OF THE INVENTION

An object of the present invention is to provide an improved dynamic-type semiconductor memory device for eliminating drawbacks of a conventional dynamic-type semiconductor memory device, and for reducing peak current in a sensing operation and for implementing a stable operation.

Another object of the present invention is to provide a dynamic-type semiconductor memory device in which data sensing can be performed with less peak current without exerting an adverse influence on an access time.

A further object of the present invention is to provide a method of driving a sense amplifier for reducing peak current in the sensing operation so that the stable sensing operation is performed.

Still another object of the present invention is to provide a method of driving a sense amplifier by which a stable sensing operation can be performed with less peak current without increasing an access time.

A dynamic-type semiconductor memory device according to the present invention has bit line pairs of a first group and bit line pairs of a second group. The memory of the invention further includes circuitry for operating at a different timing a first group of sense amplifiers provided on bit line pairs of the first group and a second group of sense amplifiers provided on bit line pairs of the second group.

Preferably, a group of sense amplifiers provided on a bit line group to which a bit line pair connected to a selected memory cell by an external address belongs is operated first.

A method of driving a sense amplifier comprises the step of activating at a different timing the first group of the sense amplifiers provided on each bit line pair of the first group of bit line pairs, and the second group of the sense amplifiers provided on each bit line pair of the second group of bit line pairs. A sense amplifier of the first sense amplifier group and a sense amplifier of the second amplifier group are arranged alternately. Each bit line pair of the first group of bit line pairs has at least one crossing portion, and each bit line pair of the second group of bit line pairs has no, or one or more crossing portions.

A method of driving a sense amplifier according to the present invention further comprise a step of first activating sense amplifiers provided on a bit line group comprised of a bit line pair selected in response to a column address applied from the exterior.

Reduction of peak current in the sensing operation without exerting an adverse influence on a read potential becomes possible because bit line pairs are divided into a first group and a second group, so that a first sense amplifier group provided on the first group of bit line pairs and a second sense amplifier group provided on the second group of bit line pairs are activated at different timing.

When a sense amplifier group corresponding to a bit line group comprising a memory cell selected by an external address is first operated, access time can be the same as that of the conventional one.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A to 3D are diagrams showing changes of bit line potentials of the dynamic-type semiconductor memory device showing FIG. 2 in a sensing operation;

FIGS. 5A to 5D are diagrams showing changes of potentials of bit line pairs of the dynamic-type semiconductor memory device shown in FIG. 4 in a sensing operation;

DESCRIPTION OF THE PREFERRED EMBODIMENTS

Figure 4:
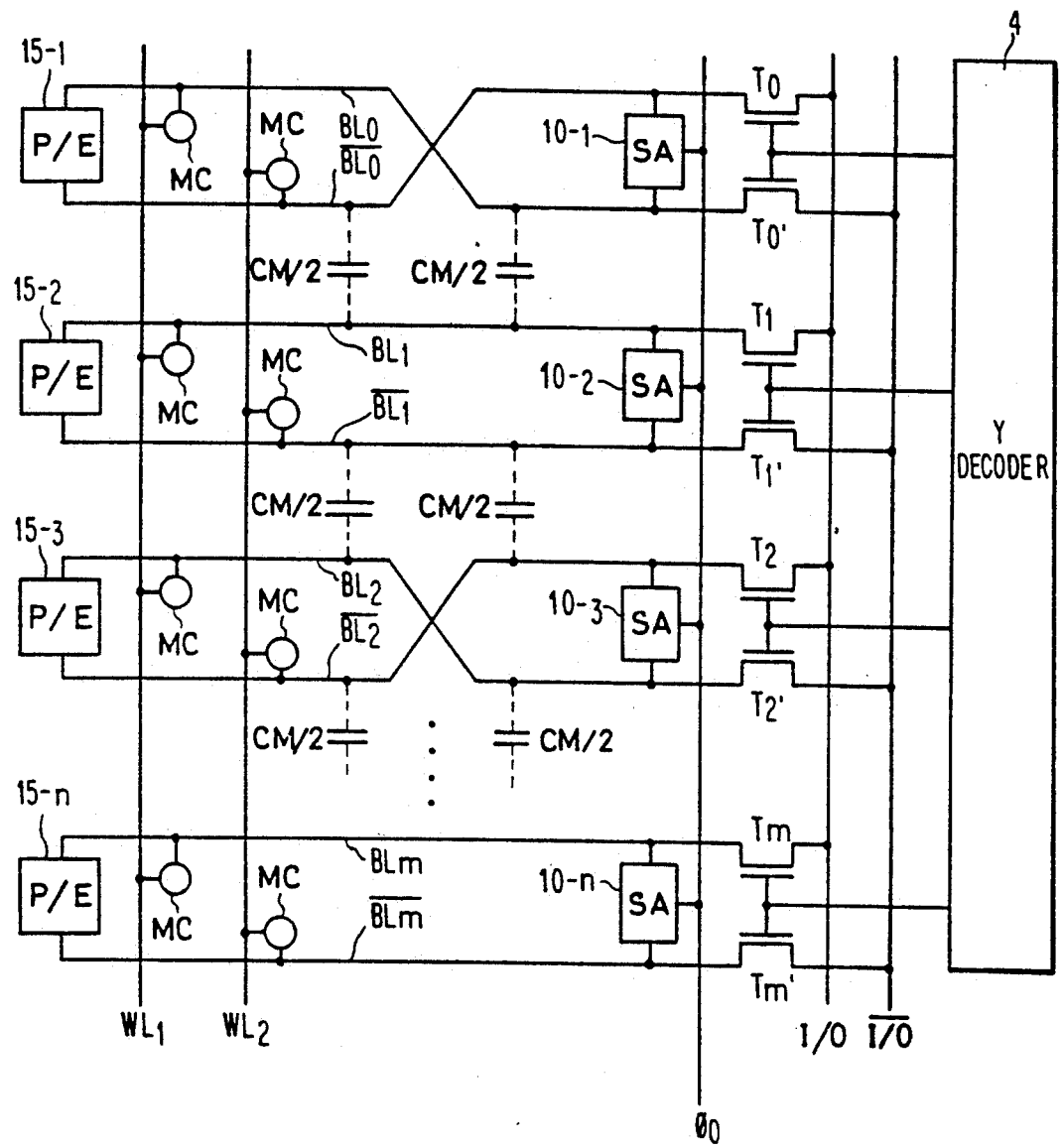
FIG. 4 is a diagram showing a structure of a part of a memory cell array another conventional dynamic-type semiconductor memory device.
Figure 5C:
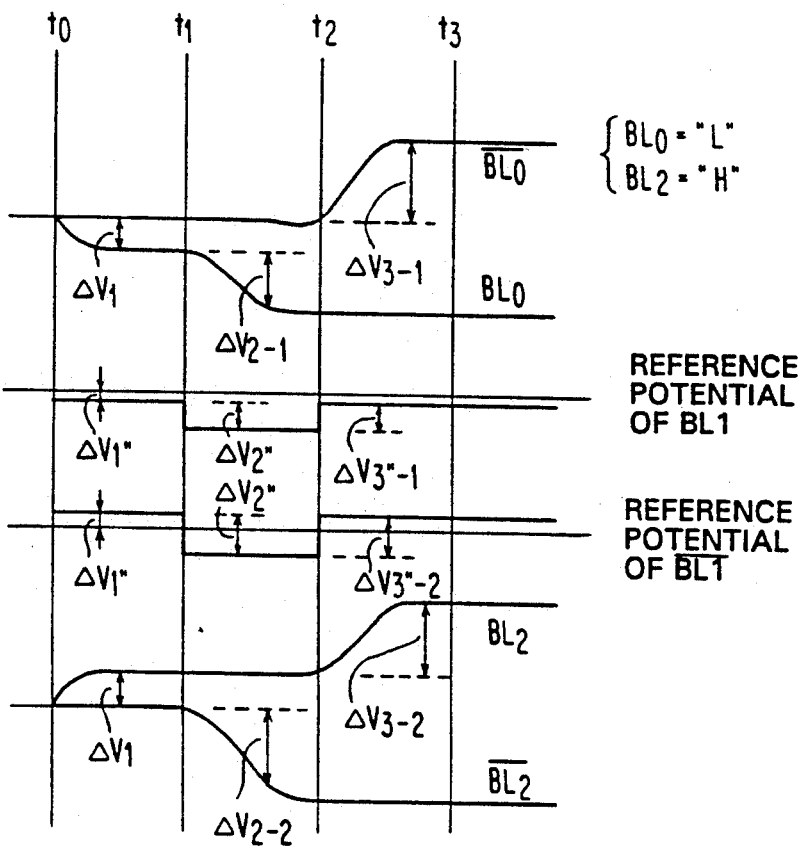
Figure 5D:
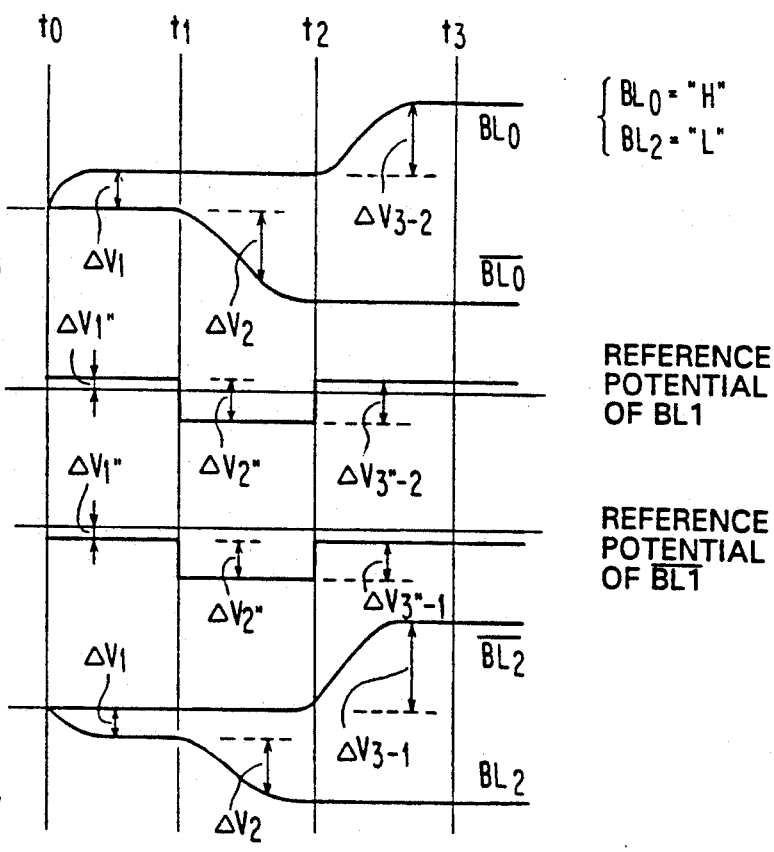
Figure 6:
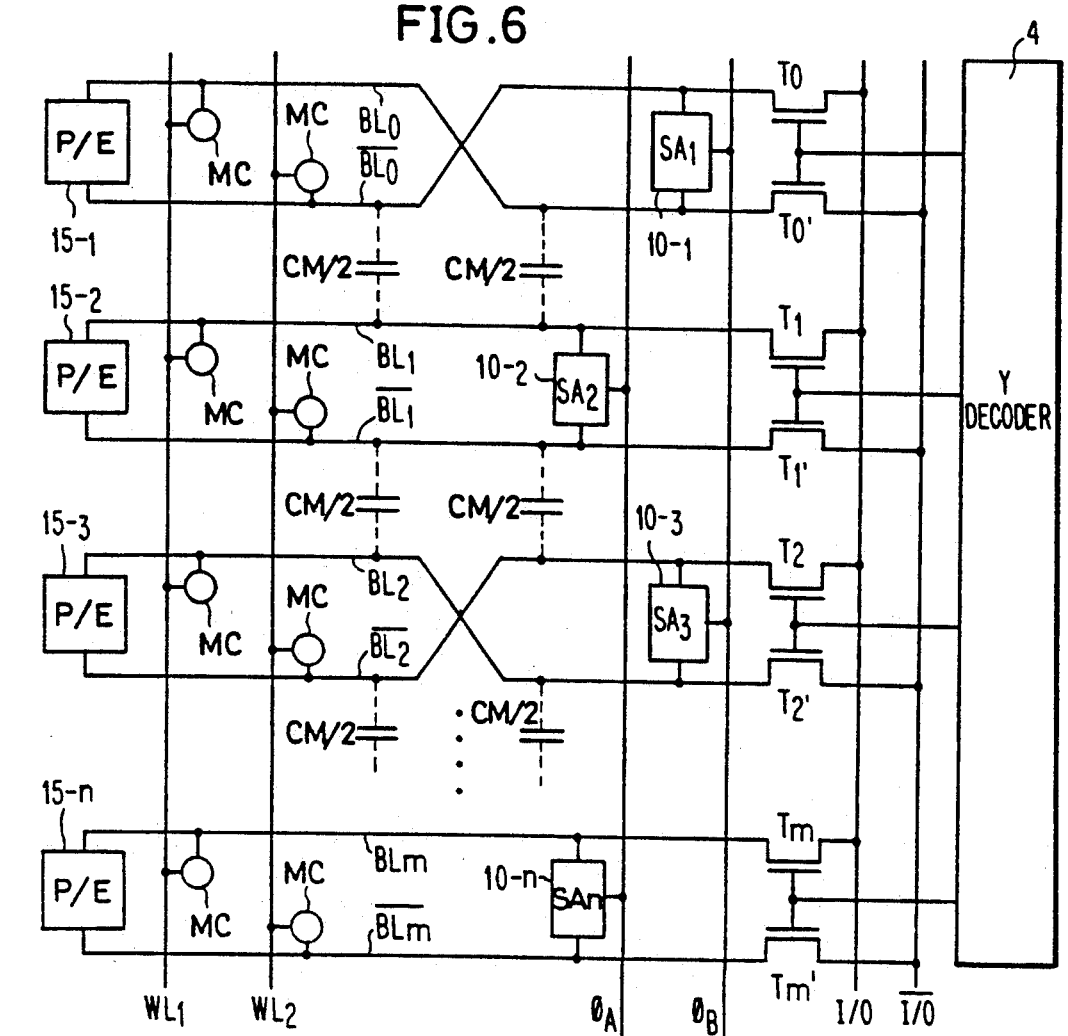
FIG. 6 is a diagram showing a structure of a main part of a dynamic-type semiconductor memory device according to one embodiment of the present invention.
Figure 6:
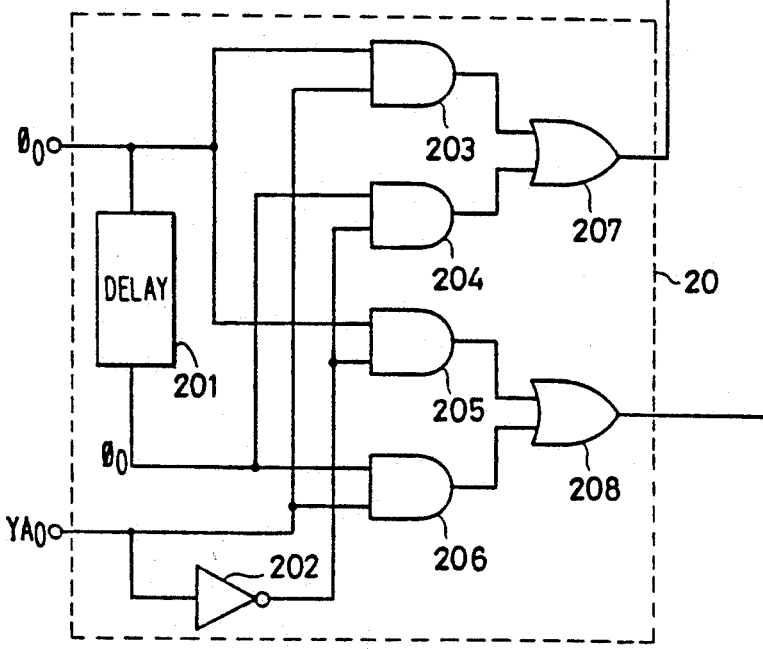

FIG. 6 is a schematic diagram showing an arrangement of the main part of a dynamic type semiconductor memory device according to one embodiment of the present invention, wherein the same reference numerals are given to the parts corresponding to the components shown in FIG. 4. Referring to FIG. 6, bit line pairs comprise a first group of bit line pairs comprised of even numbered bit line pairs BL0, $\overline{BL0}$, BL2 and $\overline{BL2}$ having crossing portions, and a second group of bit line pairs comprised of odd numbered bit line pairs BL1, $\overline{BL1}$, . . . , BLm and $\overline{BLm}$ of a non-twisted bit line structure having no crossing portion. Bit line pairs belonging to the first group of bit line pairs and bit line pairs belonging to the second group of bit line pairs are alternately disposed.

Sense amplifiers 10-1, 10-3, . . . activated in response to a sense amplifier activating signal $\phi_B$ are provided on bit lines belonging to the first group of bit line pairs. Sense amplifiers 10-2, . . . , 10-n activated in response to a sense amplifier activating signal $\phi_A$ are provided on bit lines belonging to the second group of bit line pairs.

A sense amplifier activating signal generating circuit 20 is provided in order to operate a sense amplifier group of the first group and a sense amplifier group of the second group at a different timing. The sense amplifier activating signal generating circuit 20 receives a sense amplifier activating signal $\phi 0$ and a column address YA0 of 1 bit so as to activate either one of sense amplifier activating signals $\phi_A$ or $\phi_B$ first.

The sense amplifier activating signal generating circuit 20 comprises a delay circuit 201 for delaying the sense amplifier activating signal $\phi 0$ by a predetermined time period, and an inverter 202 for inverting the column address YA0 of 1 bit. A circuitry for generating the sense amplifier activating signal $\phi_A$ comprises an AND gate 203 for receiving the sense amplifier activating signal $\phi 0$ and the column address YA0 of 1 bit, an AND gate 204 for receiving a delayed activating signal $\phi_D$ from the delay circuit 201 and an inverted column address bit from the inverter 202, and a 2-input OR gate 207 for receiving outputs of AND gates 203 and 204. The sense amplifier activating signal $\phi_A$ is outputted from the OR gate 207.

A circuitry for generating the sense amplifier activating signal $\phi_B$ comprises an AND gate 205 for receiving the sense amplifier activating signal $\phi 0$ and the inverted column address bit from the inverter 202, an AND gate 206 for receiving the delayed activating signal $\phi_D$ from the delay circuit 201 and the column address YA0 of 1 bit, and a 2-input OR gate 208 for receiving outputs of AND gates 205 and 206. The sense amplifier activating signal $\phi_B$ is outputted from the OR gate 208. The column address bit YA0 is, for example, a least significant column address bit and designates that a selected column (a bit line pair) is an even numbered or an odd numbered.

Figure 7:
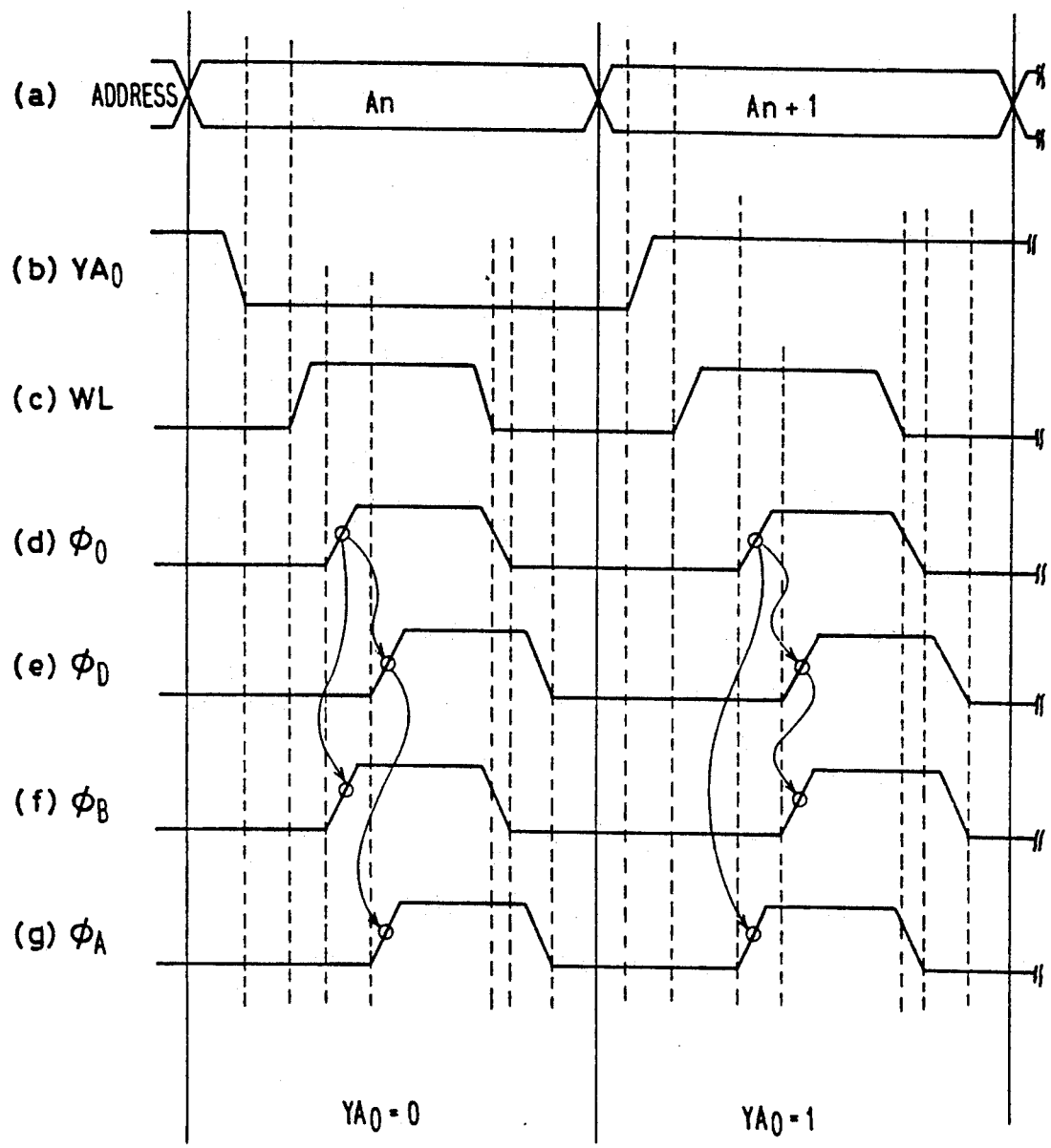
FIG. 7 is a signal waveform diagram showing operation of the circuit shown in FIG. 6.

If DRAM is of the address multiplexing scheme, the sense amplifier activating signal $\phi 0$ is generated in the same manner as that of a conventional one. More specifically, it is generated after a row address strobe signal $\overline{RAS}$ is delayed by a predetermined time period. Now, operation will be described in reference to FIG. 7 which is an operation waveform diagram of a circuit shown in FIG. 6.

First, description is made on a case in which a column (Y) address is an even numbered address, that is, a least significant address bit YA0 is "0". When an address An is applied, a least significant address bit YA0 of a column address included in the address is decided as "0" level to be applied to the sense amplifier activating signal generating circuit 20. Subsequently, a single word line is selected in response to a row address included in the address An, so that a potential of the selected word line WL rises. Then, when the potential of the word line rises and a read potential on a bit line pair is established, the sense amplifier activating signal $\phi 0$ rises.

Now, since a 1 bit column address YA0 is "0", AND gates 203 and 206 are in a disable state, and AND gates 204 and 205 are in an enable state. Accordingly, when the sense amplifier activating signal $\phi 0$ rises, an output of the AND gate 205 is raised to the "H" level, correspondingly. As a result, the sense amplifier activating signal $\phi B$ from the OR gate 208 rises to the "H" level, thereby activating sense amplifiers 10-1, 10-3, ... connected to even numbered bit line pairs, so that a potential difference on each bit line pair is amplified. Subsequently, after a predetermined time period, the delayed activating signal $\phi_D$ from the delay circuit 201 rises to the "H" level, so that an output of the AND gate 204 is raised to "H" level. As a result, the sense amplifier activating signal $\phi_A$ from the OR gate 207 rises to activate sense amplifiers 10-2, ... 10-n connected to odd numbered bit line pairs, so that signal potentials on odd numbered bit line pairs are amplified. Thereafter, a pair of the transfer gates (column selecting switch) connected to even numbered bit line pairs by the outputs from the Y decoder 4 is turned on, so that data of a selected memory cell is transferred onto data input/output buses I/O, and $\overline{I/O}$. Thereafter, after restoring of data on each bit line pair, a potential of the word line WL drops to the "L" level, and each sense amplifier activating signal drops to the "L" level, to complete one memory cycle.

Since a bit line pair connected to a selected memory cells belongs to the first group of bit line pairs comprised of even numbered bit line pairs, and sense amplifiers thereof are activated at the same timing as that in a conventional one, timing for turning on a column selecting switch from the Y decoder 4 may be the same as that in conventional one. Thus, even if the sense amplifiers are operated at different timing, the access time period in data reading will be the same as that in the conventional, so that no adverse influence will be exerted to the access time.

Operation in which a column address (Y address) is an odd numbered address, and selects a bit line pair of an odd numbered bit lines shown in FIG. 6 will be described. At this time, a least significant address bit YA0 is "1". Accordingly, when an address An +1 from the exterior is strobed, a least significant address column address bit YA0 is correspondingly decided as "1". Thereafter, a potential of a selected word line (decided by a row address included in an address A (n+1)) rises. Then, the sense amplifier activating signal $\phi 0$ rises, so that a signal potential on a bit line pair is amplified. At this time, since the least significant bit YA0 of the column address is "1", AND gates 203 and 206 are in an enable state, and AND gates 204 and 205 are in a disable state. Therefore, the output of the AND gate 203 rises to the "H" level in response to the sense amplifier activating signal so that the sense amplifier activating signal $\phi_A$ from the OR gate 207 rises, thereby activating sense amplifiers 10-2, ..., 10-n connected to even numbered columns, so that sense amplifiers 10-2, ..., 10-n connected to even numbered bit line pairs are activated to amplify a potential on each bit line pair. Subsequently, after a predetermined time period, the delayed activating signal $\phi_D$ from the delay circuit 201 rises to the "H" level. Accordingly, an output of the AND gate 206 rises to the "H" level. As a result, the sense amplifier activating signal $\phi_B$ from the OR gate 208 also rises to the "H" level, thereby activating sense amplifiers 10-1, ..., 10-3 . . . provided on bit line pairs included in odd numbered columns (or even numbered bit lines), to amplify potentials of an even numbered bit line pairs. Thereafter, a column selecting signal from the Y decoder 4 causes a pair of column selecting switches (connected to even numbered columns) to be turned on, so that selected memory cell data is transferred to I/O and $\overline{I/O}$ for outputting data.

In the foregoing description, it should be noted that since bit line pairs of the even numbered columns start from 0, they are BL0, $\overline{BL0}$, BL2 and $\overline{BL2}$, while bit lines of odd numbered columns are bit lines BL1, $\overline{BL1}$, .... More specifically, it should be noted that suffixes 1, 2, ... given to sense amplifiers are not in correspondence to even numbered columns and odd numbered columns, but not to bit line pair number.

The foregoing structure makes it possible that sensing operation of a bit line pair group including a selected memory cell is always first performed, wherein the access time can be made the same as the conventional one. More specifically, generation timing of a column selecting signal from the Y decoder 4 may be the same as the conventional one and only restoring of data (i.e. restoring operation) is required to non-selected bit line pairs, so that no adverse influence will be exerted to access time of DRAM even if the sensing timing for non-selected columns becomes later than the conventional one.

In addition, even if sense amplifiers operate at different timing, since all of the capacitive coupling noise between adjacent bit line pairs caused by coupling capacitance in sensing operation occurs in the same phase, a potential of a bit line pair which is amplified earlier does not exert an adverse influence on a signal potential of an adjacent bit line pair which is amplified later, so that sensing and restoring operation of correct data can be reliably performed.

Since a group of bit line pairs connected to sense amplifiers which start sensing operation later is amplified in the potential after each potential difference thereof becomes larger, more reliable restoring operation of data can be performed. More specifically, it is constructed such that sensing operation is activated when a bit line potential reaches an appropriate value with some operating margin of a sense amplifier, in order to make a high speed DRAM. However, from the view point of reliable reading of data, it is preferable to start sensing operation when a potential difference of a bit line pair becomes larger by starting activation of sense amplifiers as late as possible. Accordingly, as the foregoing, by starting the operation of the sense amplifiers later, more reliable detection of data is possible, so that data can be restored reliably.

Since sense amplifiers are divided into two groups and sense amplifiers in one group are activated at a different timing from that in the other group, it is possible to reduce peak current flowing through sense amplifiers in sensing operation by dispersion thereof to prevent malfunctions of circuits due to deviation of a substrate potential, and therefore to reduce consumed current.

Figure 8:
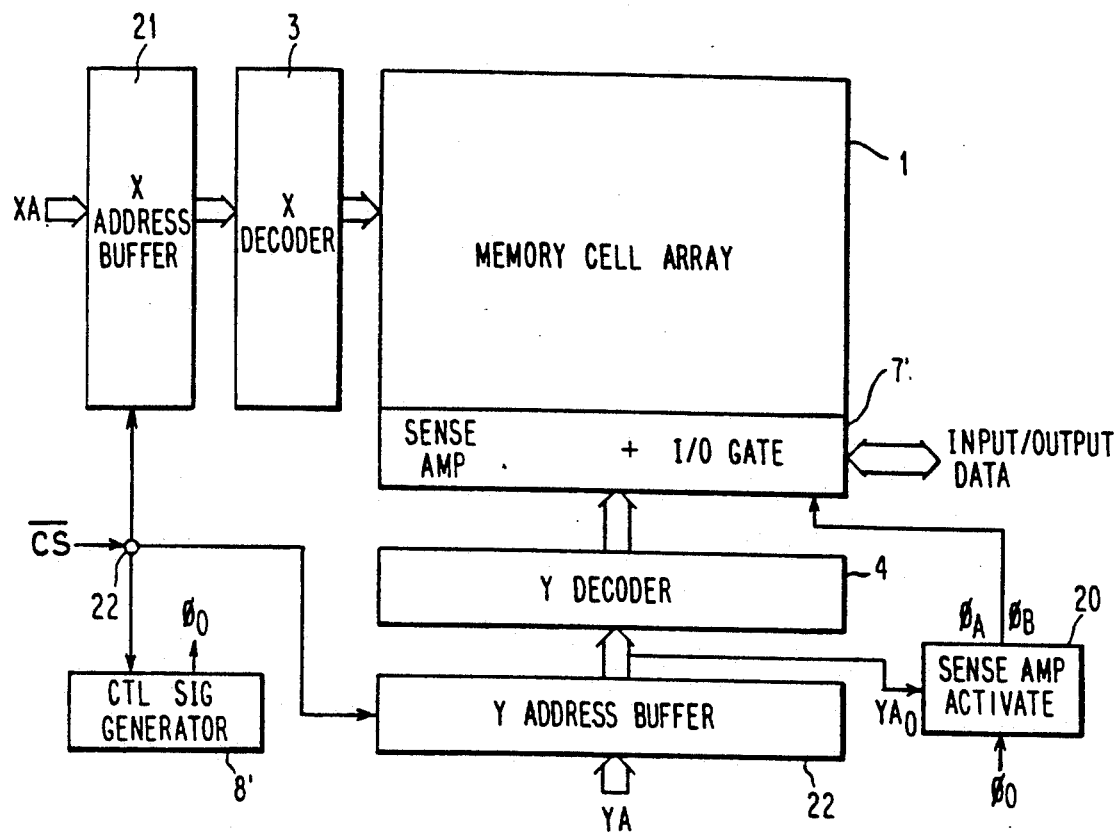
FIG. 8 is a schematic diagram showing an entire structure of a dynamic-type semiconductor memory device according to one embodiment of the present invention.
Figure 9:
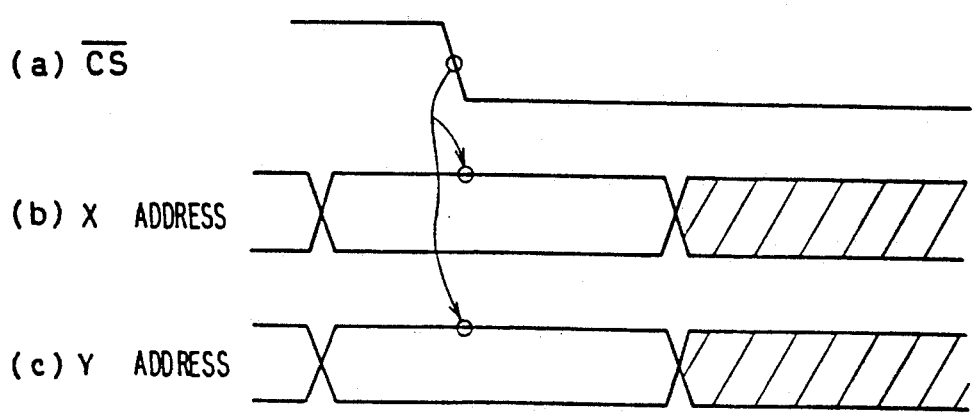
FIG. 9 is a signal waveform diagram showing strobing timing of an address signal of the dynamic-type semiconductor memory device shown in FIG. 8.

As the foregoing, since determination of an even numbered addresses or an odd numbered address is made by using a least significant bit of a column address so that activating signals of sense amplifiers are generated at different timing, the column address is needed to be asserted at a timing as early as possible. However, in a conventional address multiplex scheme, there is a limit on establishing the column address as soon as possible. Accordingly, it is preferable to employ a structure in which a row address XA and a column YA are applied simultaneously as shown in FIG. 8, in order to assert the column address as soon as possible. More specifically, in the structure shown in FIG. 8, the row address XA is applied to an X address buffer 21, and the column address YA is applied to an Y address buffer 22. The activating timing of the X address buffer 21 and the Y address buffer 22 are defined by a chip selecting signal $\overline{CS}$ applied to a terminal 22, so that the X address buffer 21 and the Y address buffer 22 can be activated at the same timing, thereby making it possible that an internal row address and an internal column address are generated at the same timing. A least significant address bit YA0 from the Y address buffer 22 is applied to the sense amplifier activating signal generating circuit 20. A sense amplifier activating signal $\phi 0$ is generated from a control signal generator 8' in response to the chip selecting signal $\overline{CS}$ so as to be applied to the sense amplifier activating signal generating circuit 20. This structure makes it possible that an X address and a Y address are accepted in response to the chip selecting signal $\overline{CS}$ as shown in an operation waveform of FIG. 9, so as to generate an internal row address and an internal column address, thereby making it possible that the column address bit YA0 is generated at a timing earlier as possible than that of the above DRAM structure shown in FIG. 6,.

Figure 10:
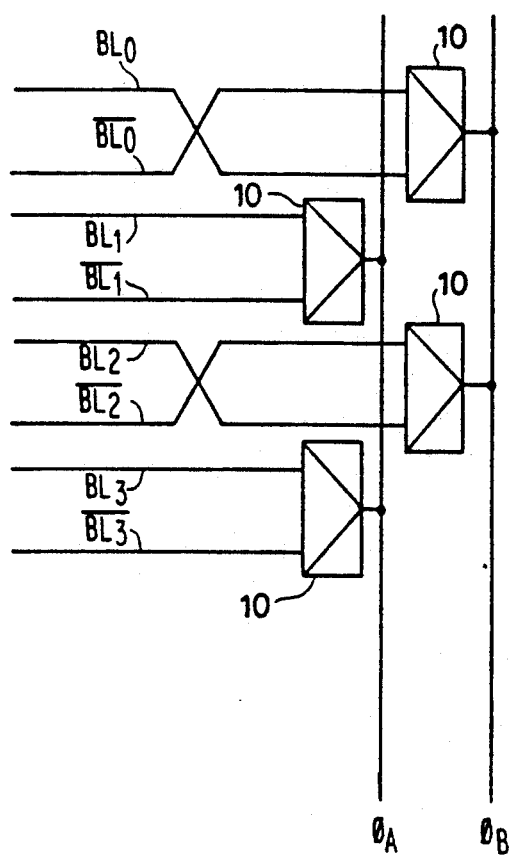
FIG. 10 is an enlarged diagram of an arrangement of sense amplifiers of a dynamic-type semiconductor memory device according to one embodiment of the present invention.

As is apparent from a schematically enlarged diagram of the arrangement of the sense amplifier shown in FIG. 10, the above structure makes it possible that a sense amplifier connected between a bit line pair of an even numbered column and a sense amplifier connected between a bit line pair of an even number column are arranged in two columns in correspondence with two signal lines, so that a pitch of sense amplifiers is twice the pitch of sense amplifiers conventionally arranged in a single column, a bit line pitch becomes narrower in more highly integrated DRAM, whereby it is possible to be easily adapted even if a pitch of a sense amplifier is narrower.

Figure 11:
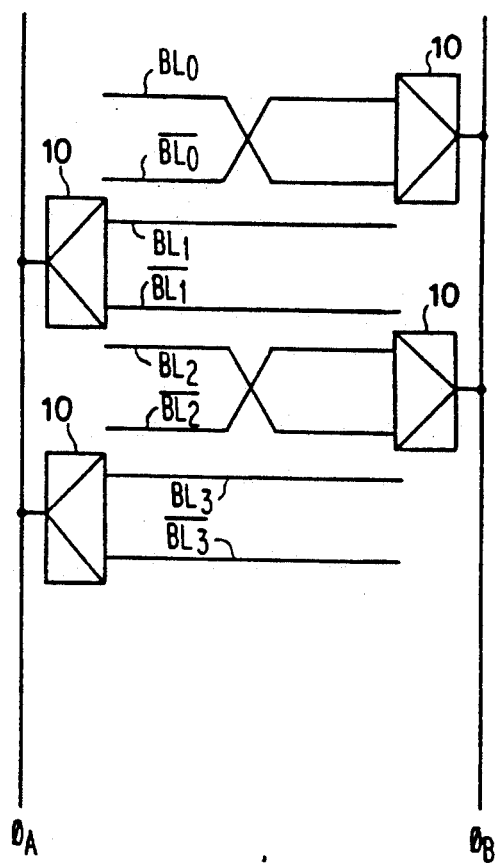
FIG. 11 is a schematic diagram showing an arrangement of sense amplifiers of a dynamic-type semiconductor memory device according to another embodiment of the present invention.

While the above embodiment is constructed such that sense amplifiers are provided on the same side of bit lines, the same effect as that of the above embodiment can be obtained even if sense amplifiers are alternately disposed on both sides of bit lines as shown in FIG. 11. In this case, a pitch of sense amplifiers can be larger in comparison with that of a conventional structure.

Figure 12:
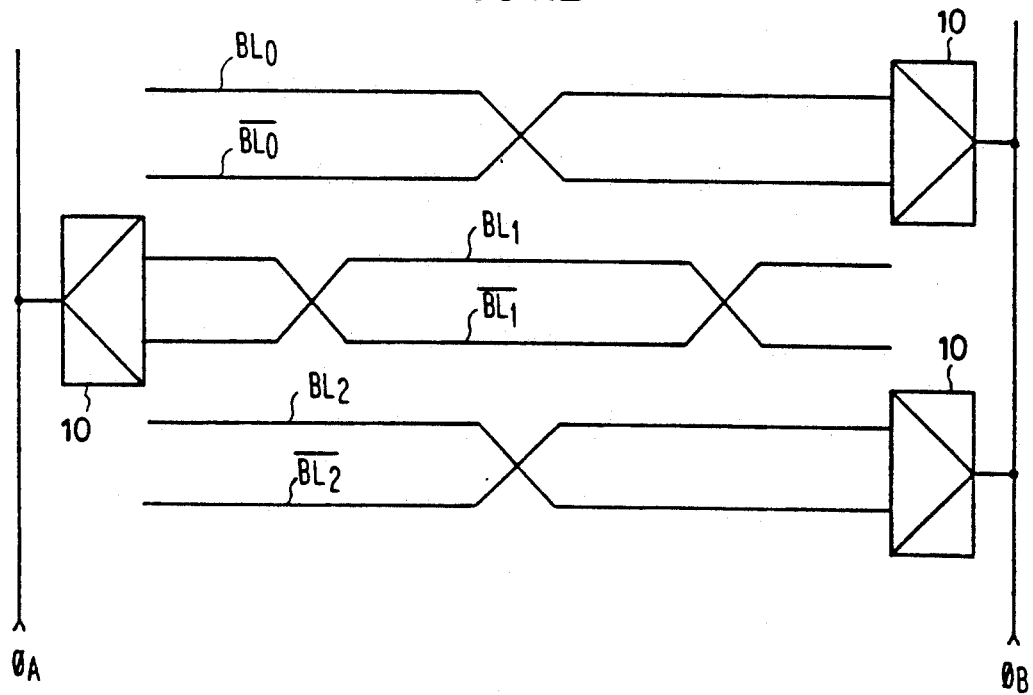
FIG. 12 is a schematic diagram showing an arrangement of a memory cell array of a dynamic-type semiconductor memory device according to a further embodiment of the present invention.

In addition, while a twisted bit line pair and a non-twisted bit line pair are alternately disposed in the above embodiment, the same effect as that in the above embodiment can be obtained in such a twisted bit line pair structure as shown in FIG. 12. More specifically, even if sense amplifiers operate in different timing, the twisted bit line pair arrangement enables all the capacitive coupling noise between bit line pairs caused by the operation of the sense amplifier to be in the same phase, so that all the noise is cancelled by the sense amplifier, whereby a reliable sensing operation is possible.

Although, in the above embodiment, description was given of a structure in which a memory cell array is formed of one block, a structure in which operation of a sense amplifier is different in each block may be employed, even if a memory cell array is divided into a plurality of blocks, to obtain the same effect as in the above embodiment.

In addition, although in the above embodiment, a least significant bit of a column address is employed in order to distinguish even numbered columns and odd numbered columns, a most significant bit of a column address may be employed to obtain the same effect as in the above embodiment.

Now, a description will be given of a structure by which activation timing of sense amplifiers can be shifted in an address multiplexing DRAM.

Figure 13:
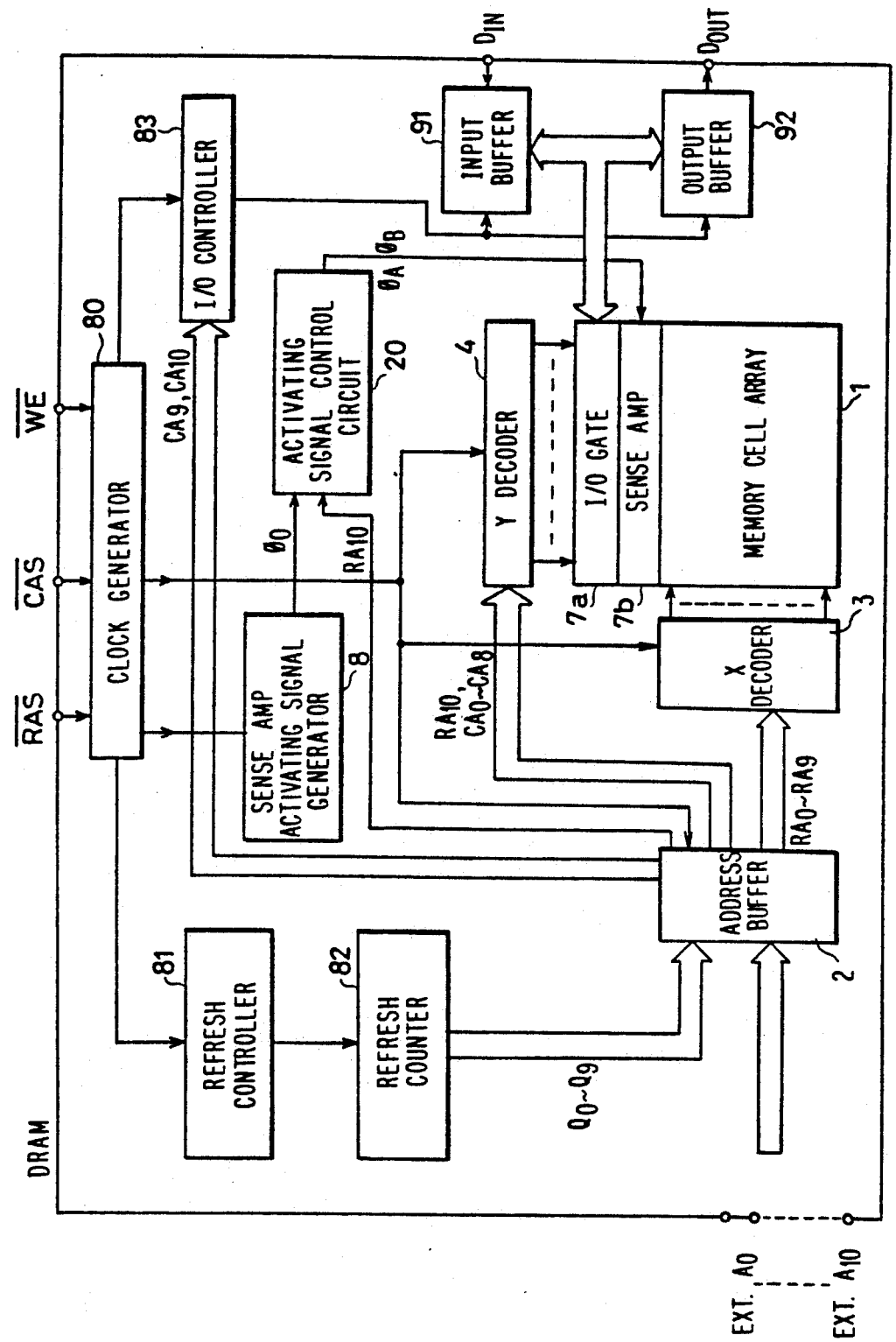
FIG. 13 shows an overview of a memory device according to another embodiment of the invention.

FIG. 13 is a schematic diagram of an entire structure of a memory device according to another embodiment of the present invention. The semiconductor memory device shown in FIG. 13 has a memory capacity of 4M bits and receives 11-bit external address signals ext.A0-- ext.A10. Time-division-multiplexed external address signals ext.A0 -ext.A10, of a row address and a column address are applied to the semiconductor memory device. Accordingly, the semiconductor memory device has an address input terminal used in common for row addresses and column addresses.

Referring to FIG. 13, the semiconductor memory device comprises an address buffer 2 for receiving externally applied address signals ext.A0-ext.A10 and a refresh address Q0-Q9 from a refresh counter 82 to generate an internal row address RA0-RA10 and an internal column address CA0-CA10, an X decoder 3 for receiving least significant ten bits RA0-RA9 of the internal row address from the address buffer 2 to select corresponding rows from a memory cell array 1, and an Y decoder 4 for receiving the most significant row address bit RA10 and least significant nine bits CA0-- CA8 of the internal column address from the address buffer 2 to select the corresponding columns in the memory cell array 1. As will be described in detail later , the memory cell array 1 is divided into 16 subarray blocks, wherein one word line is selected in each of four subarray blocks by the internal row address RA0-RA9.

In this embodiment, the Y decoder 4 receives the most significant row address bit RA10 as a part of the column address signals, in order to progress operation timing of sense amplifiers. The most significant internal row address bit RA10 is used for designating even numbered columns and odd numbered columns in the memory cell array 1.

The semiconductor memory device according to the present invention further comprises a sense amplifier activating signal generator 8, responsive to an internal clock signal from a clock generator 80, for generating a sense amplifier activating signal $\phi 0$, and an activating signal control circuit 20, responsive to the sense amplifier activating signal $\phi 0$ from the sense amplifier activating signal generator 8 and the most significant internal row address bit RA10 from the address buffer 2, for generating internal sense amplifier activating signals $\phi_A$ and $\phi_B$. The activating signal control circuit 20 renders either of the activating signals $\phi_A$ or $\phi_B$ to be active first according to the most significant bit RA10.

The semiconductor memory device shown in FIG. 13 further comprises the clock generator 80, responsive to externally applied control signals $\overline{RAS}$, $\overline{CAS}$ and $\overline{WE}$, for generating internal clock signals, a refresh controller 81, responsive to the internal clock signals from the clock generator 80, for setting operation timing for refreshing memory cell data in the memory cell array 1, the refresh counter 82, responsive to the signal from the refresh controller 81, for generating a signal for designating a row to be refreshed, an I/O controller 83 for decoding two bits of most significant column addresses CA9 and CA10 of the internal column addresses from the address buffer 2 to further select one of the selected four blocks, and an input buffer 91 and an output buffer 92 responsive to the selecting signal from the I/O controller 83 for transferring data to and from the selected block, respectively. Decoding timing of the I/O controller 83 responds to the internal clock signals generated in response to the signal $\overline{CAS}$ from the clock generator 80. The signal $\overline{WE}$ is a write enable signal and determines whether the input buffer 91 or the output buffer 92 is to be activated.

Figure 1:
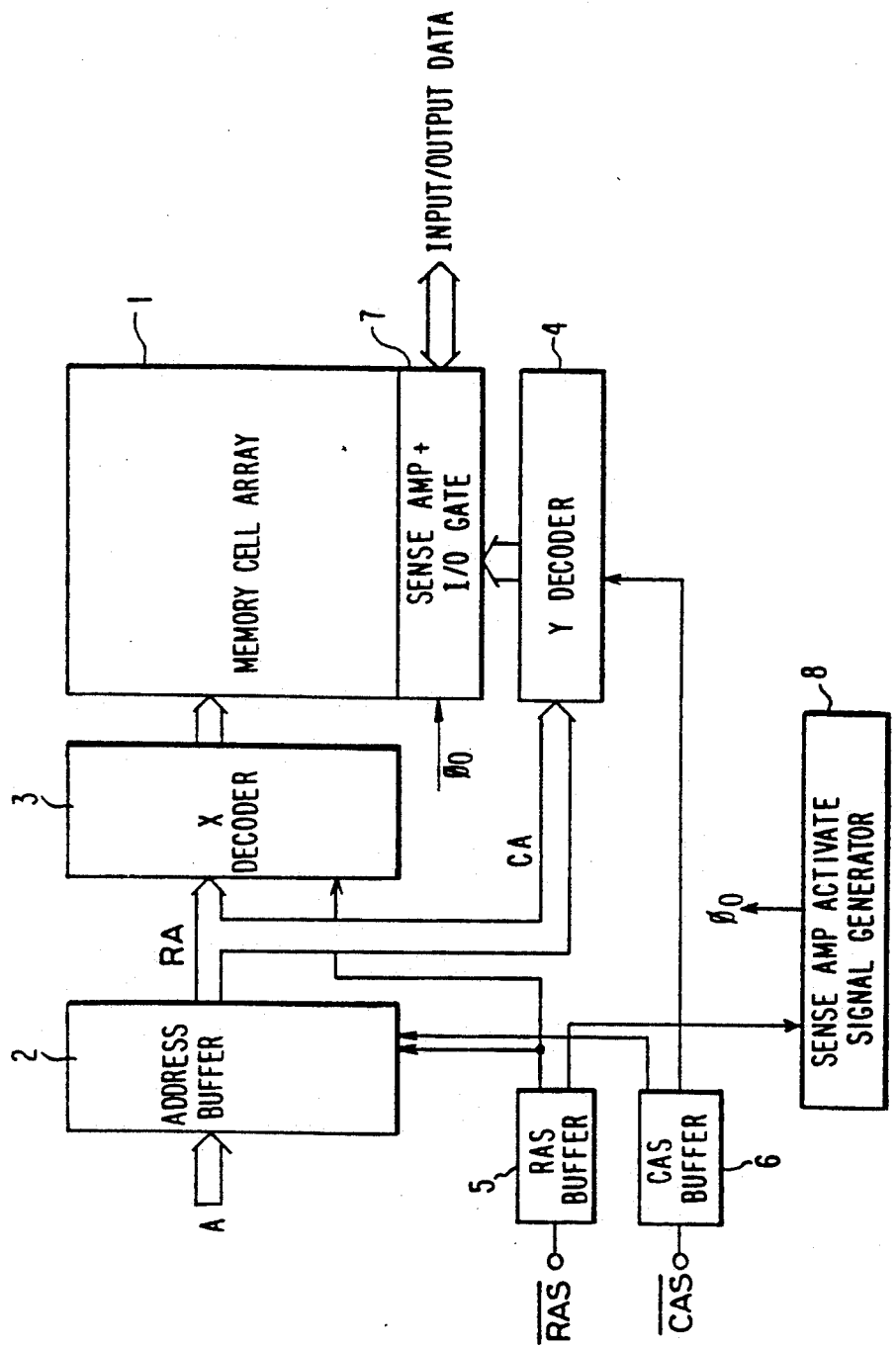
FIG. 1 is a schematic diagram showing an entire structure of a conventional dynamic-type semiconductor memory device.

The rest of the structure is the same as that of the semiconductor memory device shown in FIG. 1 and the same reference numerals are added to the corresponding portions, wherein only the I/O gate and the sense amplifiers are shown as separate blocks to which the reference numerals 7a and 7b are added, respectively.

Figure 14:
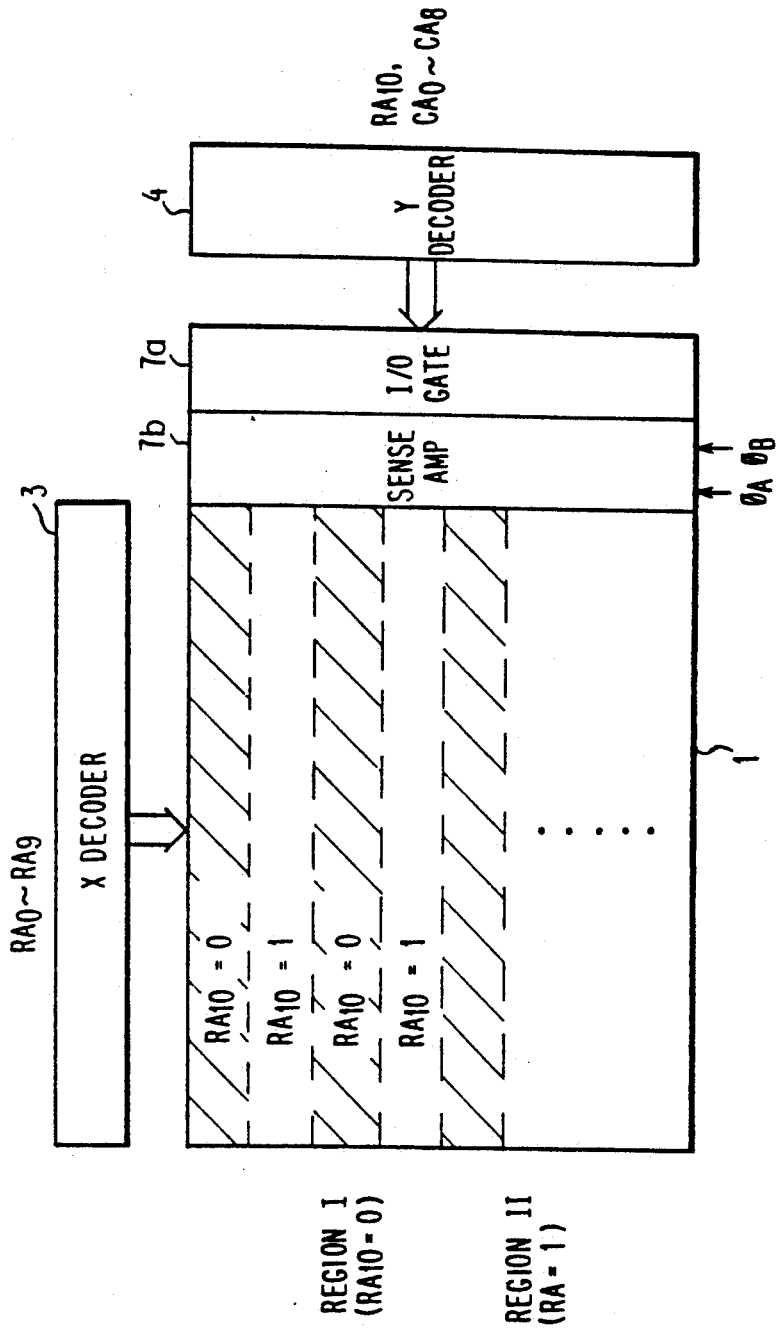
FIG. 14 shows a schematic structure of the major part of the memory device shown in FIG. 14.

FIG. 14 is a conceptional diagram showing a specific correspondence between address signals and memory cell regions in a memory cell array. As described above, the internal row address signals RA0–RA9 are applied to the X decoder 3 while the most significant internal row address bit RA10 and the internal column address signals CA0–CA8 are applied to the Y decoder 4. The most significant internal row address bit RA10 applied to the Y decoder 4 is used for identifying even numbered columns and odd numbered columns in the memory array 1. Namely, logic "0" of the most significant internal row address bit RA10 indicates a region I shown with oblique lines and logic "1" of the bit RA10 defines a region II. Accordingly, since these regions I and II are disposed alternately in the array, the most significant address bit RA10 can indicate whether the selected column belongs to even numbered columns or odd numbered columns.

Figure 15A:
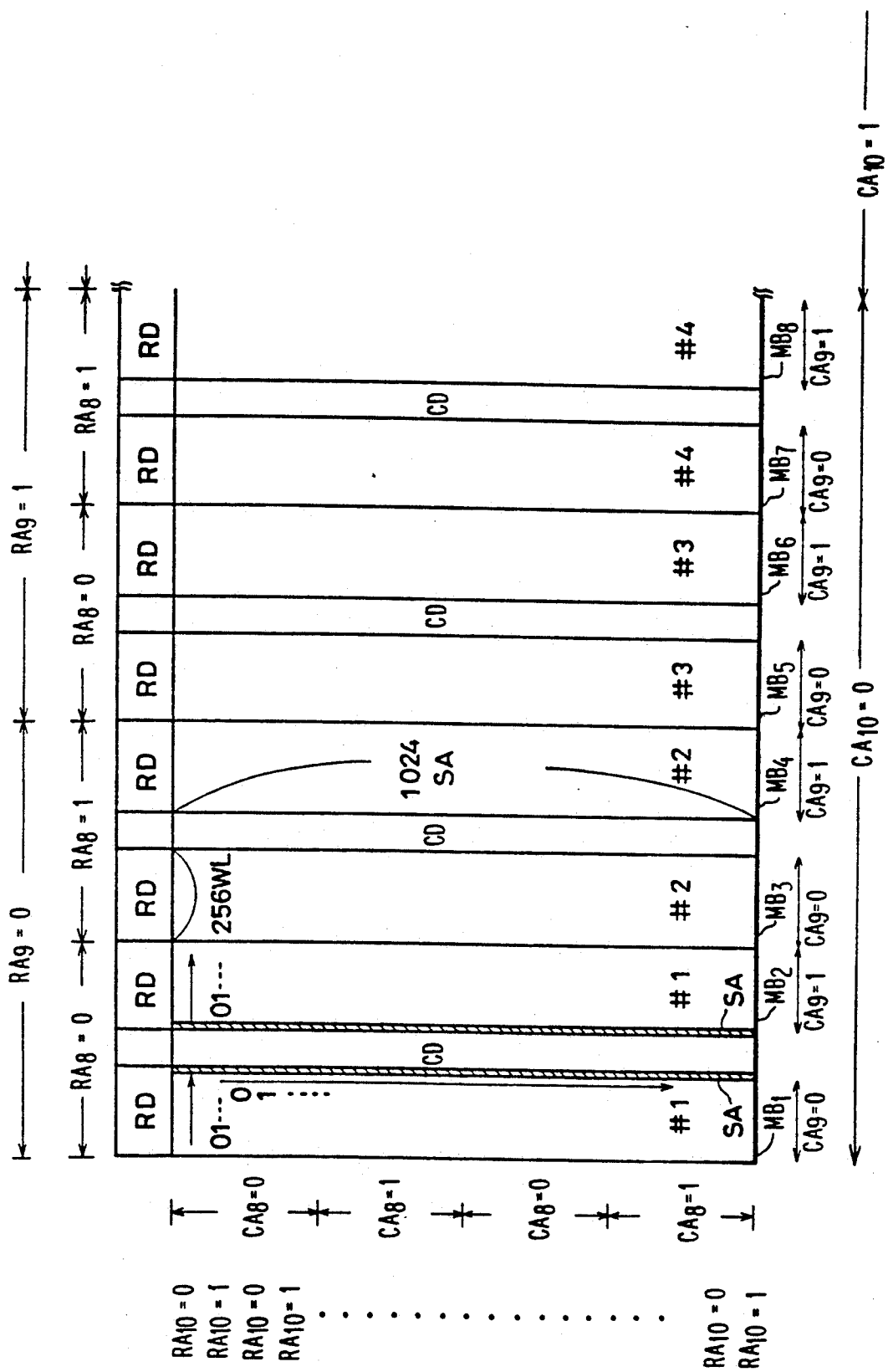
FIGS. 15A and 15B show specific correspondence between address bits and array arrangement of the memory device shown in FIG. 13.
Figure 15B:
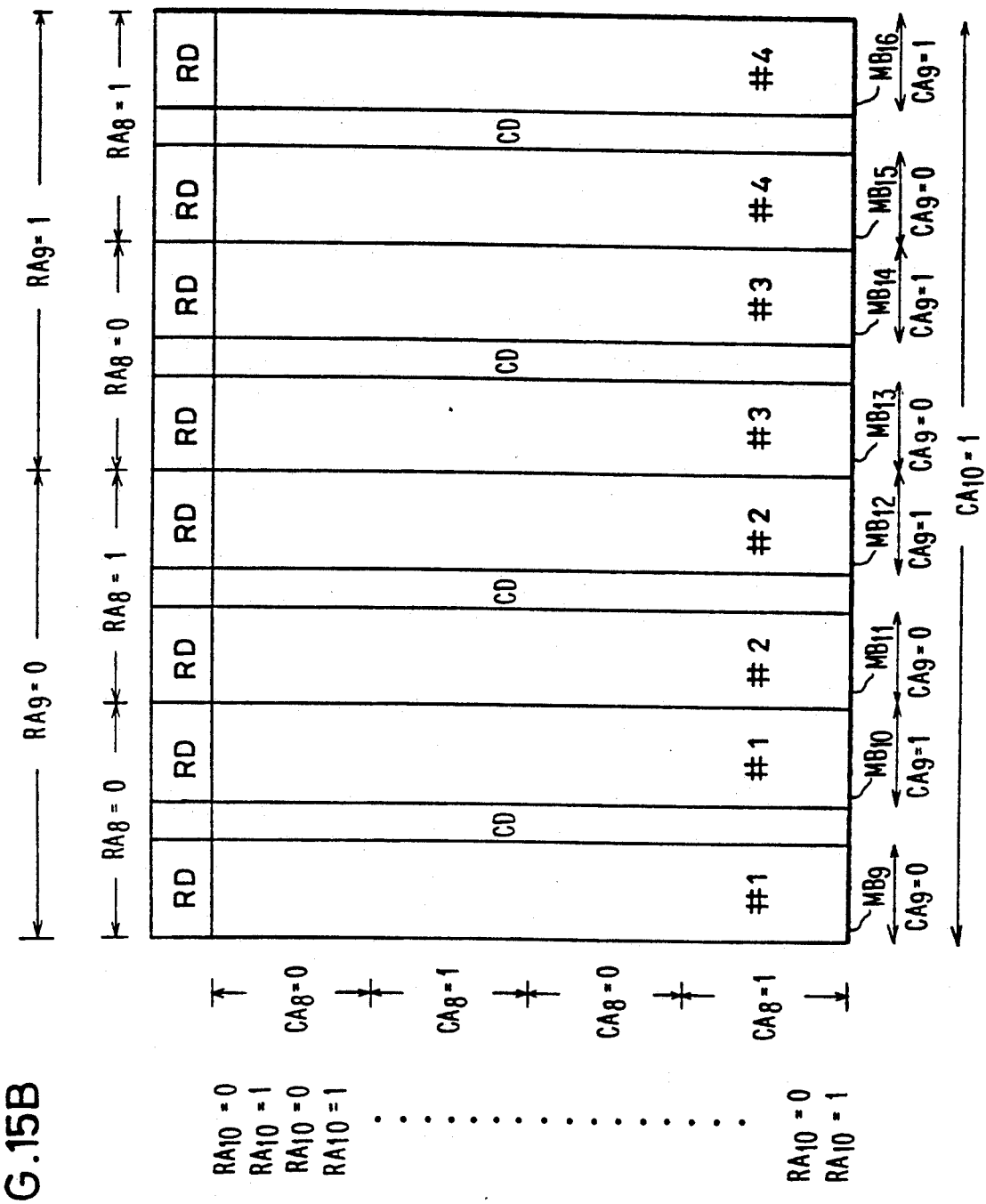

FIGS. 15A and 15B are diagrams showing correspondences between address bits and locations of selected memory cells in a memory cell array 1 having a memory capacity of 4M bits. Referring to FIGS. 15A and 15B, the memory cell array 1 is divided into 16 subarray blocks MB1–MB16. Each of the subarray blocks MB1–MB16 has memory cells arranged in 256 rows and 1024 columns. Provided for each of the subarray blocks MB1–MB16 is a row decoder RD for selecting one row from the corresponding array block in response to the internal row address signals RA0–RA7.

One column decoder CD is provided for two subarray blocks. Each of the column decoders CD decodes ten bit address signals RA10, CA0–CA8 of the internal column address signals to select one column from each of the corresponding blocks. Accordingly, one column decoder CD selects two columns. Even numbered columns and odd numbered columns in the memory cell array, that is, in each of the subarray blocks MB1–MB16, are designated by the most significant internal row address bit RA10.

The internal column address bit CA8 selects one region from the four divided regions in each of the subarray blocks MB1–MB16.

The internal row address bit RA9 selects half of the subarrays MB1–MB16, that is, eight subarrays. The internal row address RA8 selects four subarrays from the eight subarrays selected by the internal row address bit RA9. For example, when both of RA9 and RA8 are logic "1", the subarray blocks MB7, MB8, MB15 and MB16 are selected. In a semiconductor memory device of 4M bits, usually only the subarray blocks designated by the two bits internal row addresses RA9 and RA8 are activated, in which selection operation, that is, row and column selecting and sensing operations are performed.

Two bits of most significant address signals CA9 and CA10 select one of the four selected subarray blocks. More specifically, if RA9="1", RA8="1", CA9="1" and CA10="1", a data writing/reading operation is performed for the memory cell selected in the subarray block MB16 in the memory cell array.

In the structures shown in FIGS. 15A and 15B, representations #1–#4 allotted to the respective subarray blocks MB1–MB16 denote the subarray blocks to be selected simultaneously by the two bit row addresses. In the two subarray blocks having the same representation #, the columns are selected by the same column decoder CD.

Sense amplifiers SA are provided adjacent to the column decoder CD in each subarray block. In the embodiment of the present invention, it can be determined by using the most significant row address bit RA10 whether selected memory cells belong to the even numbered columns or the odd numbered columns. The most significant address bit RA10 is capable of differentiating activating timings of the sense amplifiers provided to the even numbered column addresses and to the odd numbered column addresses. Namely, when a selected memory cell belongs to an even numbered column, the sense amplifiers provided to the even numbered column are first activated and then the sense amplifiers provided to the odd numbered columns are activated.

The most significant internal row address bit RA10 is applied to the controller 20 shown in FIG. 6 instead of the column address bit YA0. Accordingly, if RA10="0", indicating that columns of the even numbered column addresses are designated, as will be clear understood by replacing YA0="0" with RA10="0" in the operation waveform diagram shown in FIG. 7, the signal $\phi B$ is raised to "H" first and then the signal $\phi A$ is raised. If the bit RA10="1", similarly, the control signal $\phi A$ is first raised to be active and then the signal $\phi B$ is raised. Therefore activation timings of sense amplifiers can be shifted even by the use of the address bit RA10.

In the above described structure, the most significant row address bit RA10 is used as a part of a column address. In the address multiplexing system, row address signals and column address signals are applied into the device through the same pin terminals. Accordingly, in the structure wherein the most significant row address bit RA10 is simply applied to the Y decoder 4, since the decoding timing of the Y decoder 4 is provided by the signal $\overline{CAS}$, the Y decoder 4 may receive not the row address bit RA10, but the column address CA10. Accordingly, the column selection and the selection of sense amplifier activating timing might not match in some cases. Accordingly, in order that the Y decoder 4 reliably decodes the address signals RA10, CA0–CA8 so as to select bit line pairs connected to the first activated sense amplifiers, it is necessary for the most significant internal row address bit RA10 to be continuously applied to the Y decoder 4 regardless of the internal column address bit CA10. This is also the case for the sense amplifier activating signal control circuit 20. In the address multiplexing system, the address buffer has a structure in which the internal row address continuously transferred as shown in FIG. 16.

Figure 16:
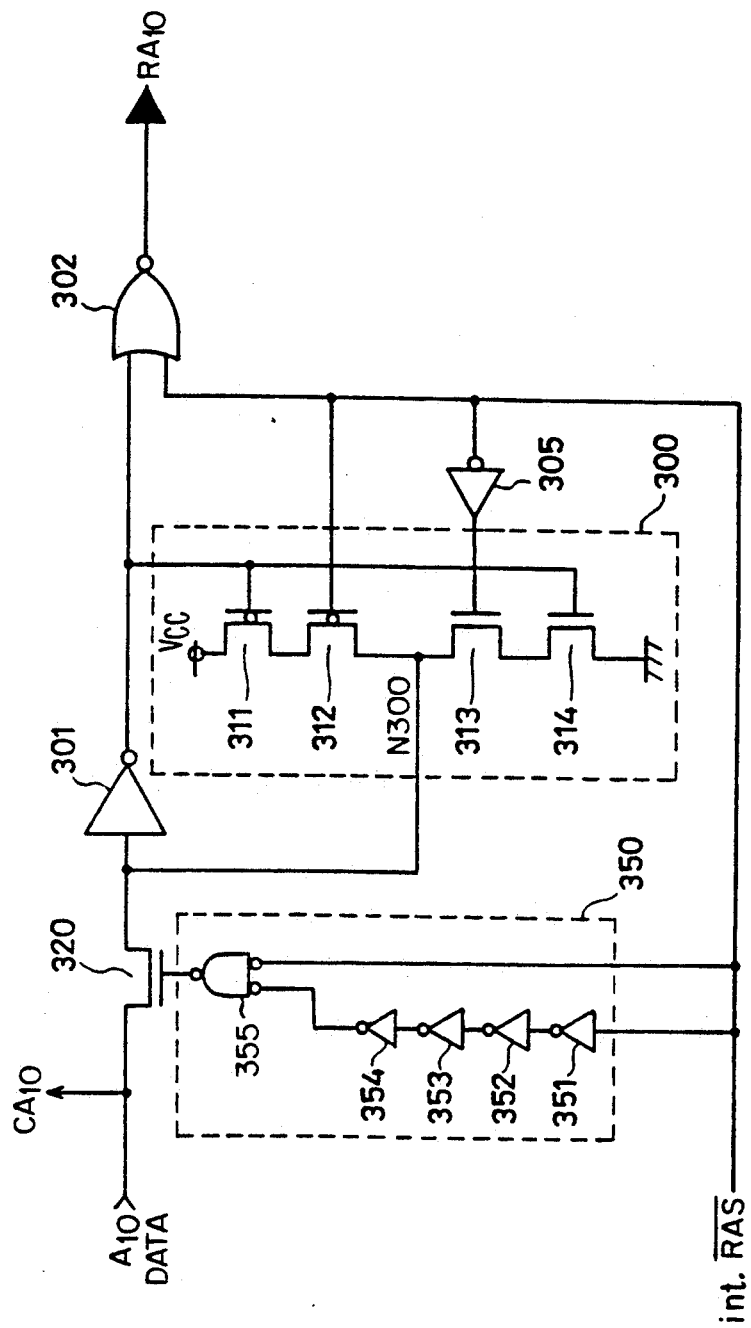
FIG. 16 shows a circuitry for generating a group designating signal employed in the memory device shown in FIG. 13.

FIG. 16 shows one example of an address buffer circuit structure for continuously applying the most significant row address bit RA10 to the Y decoder 4 and to the control circuit 20. Referring to FIG. 16, the address buffer circuit comprises a fall delaying circuit 350 for delaying by a predetermined time period a fall of the internal clock signal int.$\overline{RAS}$ generated in response to the externally applied control signal $\overline{RAS}$, an inverter circuit 300 activated in response to the internal clock signal int.$\overline{RAS}$, an inverter 301 for receiving the internal address signals from the address buffer 2 and an NOR gate 302 for receiving an output of the inverter 301 and the internal clock signal int.$\overline{RAS}$.

The inverter circuit 300 has a p channel MOS transistor 311 having one conduction terminal connected to receive a power supply potential Vcc and a gate connected to the output of the inverter 301, a p channel MOS transistor 312 having one conduction terminal connected to the other conduction terminal of the MIS transistor 311, a gate receiving the internal clock signal int.$\overline{RAS}$ and the other conduction terminal connected to an output terminal N300, an n channel MIS transistor 313 having one conduction terminal connected to the output terminal N300 and a gate receiving the internal clock signal int.$\overline{RAS}$ through an inverter 305, and an n channel MOS transistor 314 having one conduction terminal connected to the other conduction terminal of the transistor 313, a gate connected to the output of the inverter 301 and the other conduction terminal connected to the other power supply potential (ground potential).

The fall delaying circuit 350 comprises series connected four stages of inverters 351, 352, 353 and 354 and a logic gate 354 for receiving an output of the inverter 354 and the internal clock signal int.$\overline{RAS}$. The four-stage serial connected inverters 351–354 constitute a delay circuit for delaying the internal clock signal int.$\overline{RAS}$ by a predetermined time period (a time period longer than that for establishing the row address bit RA10 and shorter than that before the application of the signal $\overline{CAS}$). The logic gate 345 has the same function as that of the OR gate for outputting a signal of "L" only when a signal of "L" is applied to both inputs thereof.

This circuit further comprises an n channel MOS transistor 320 responsive to the output of the fall delaying circuit 350 to enter an off-state to cut off an input (A10) of the address buffer 2 from the internal row address bit RA10. Now operation thereof will be described briefly.

Figure 2:
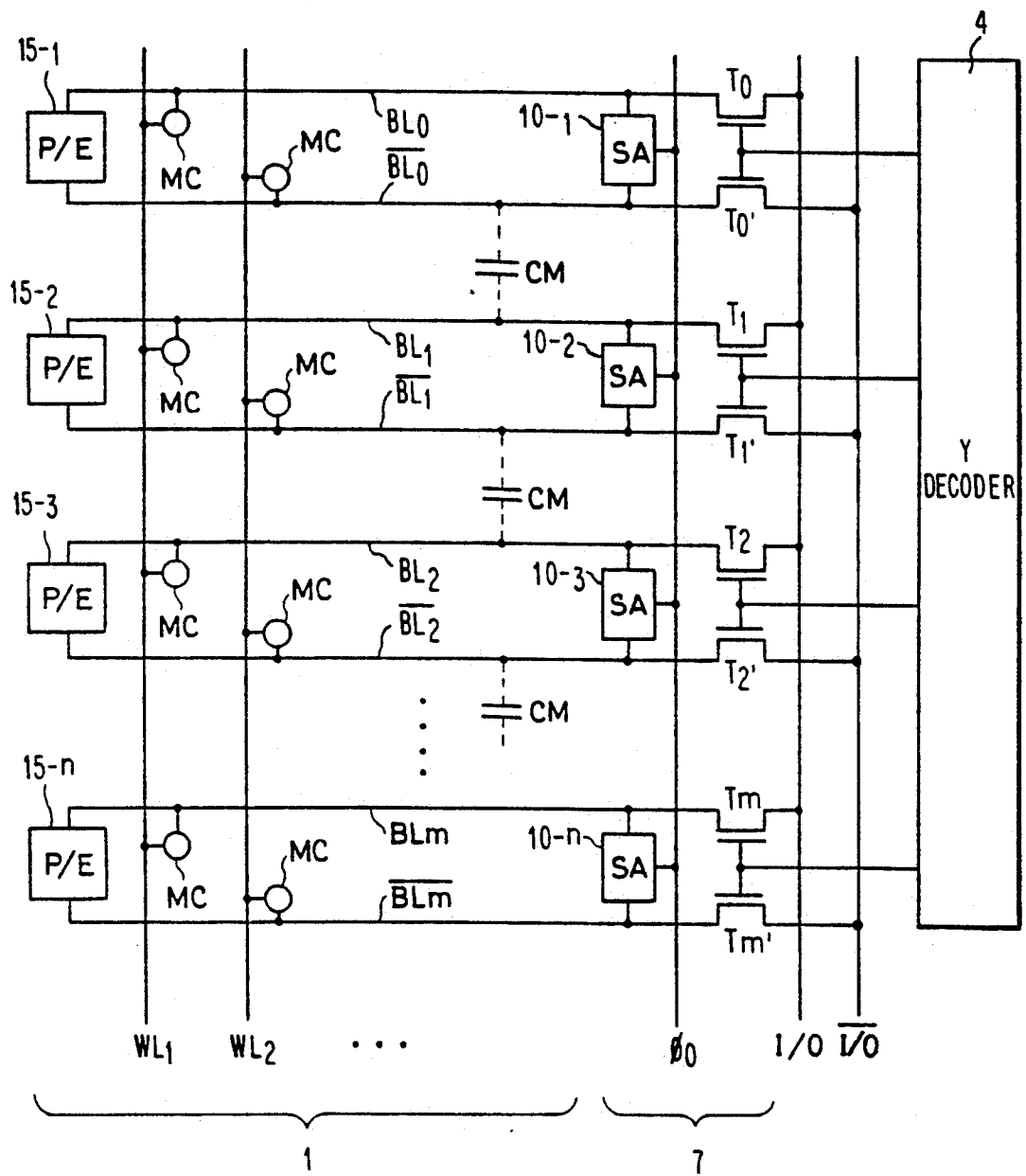
FIG. 2 is a schematic diagram showing a main part of a conventional dynamic-type semiconductor memory device.
Figure 3A:
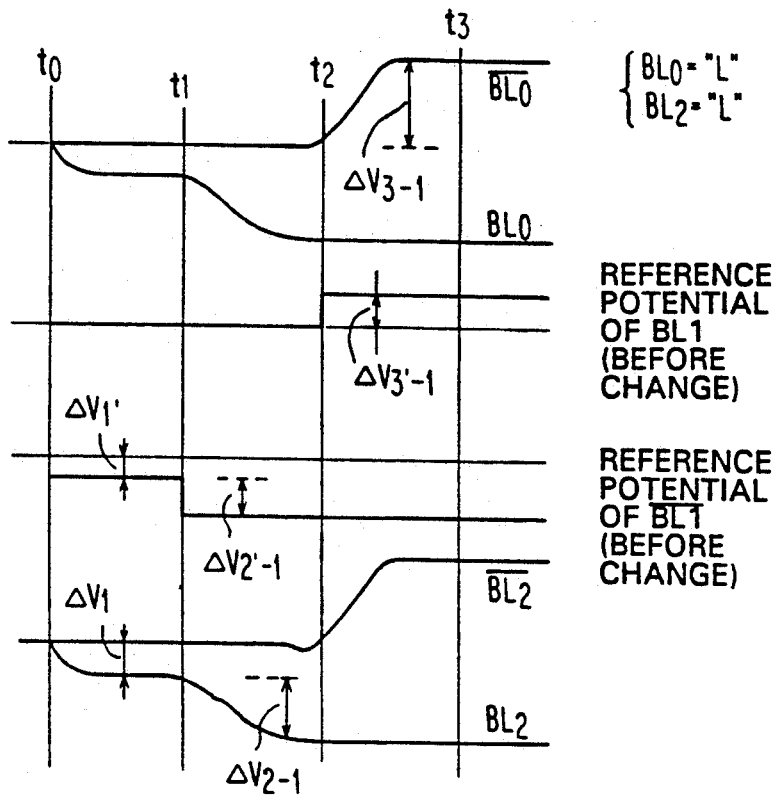
Figure 3B:
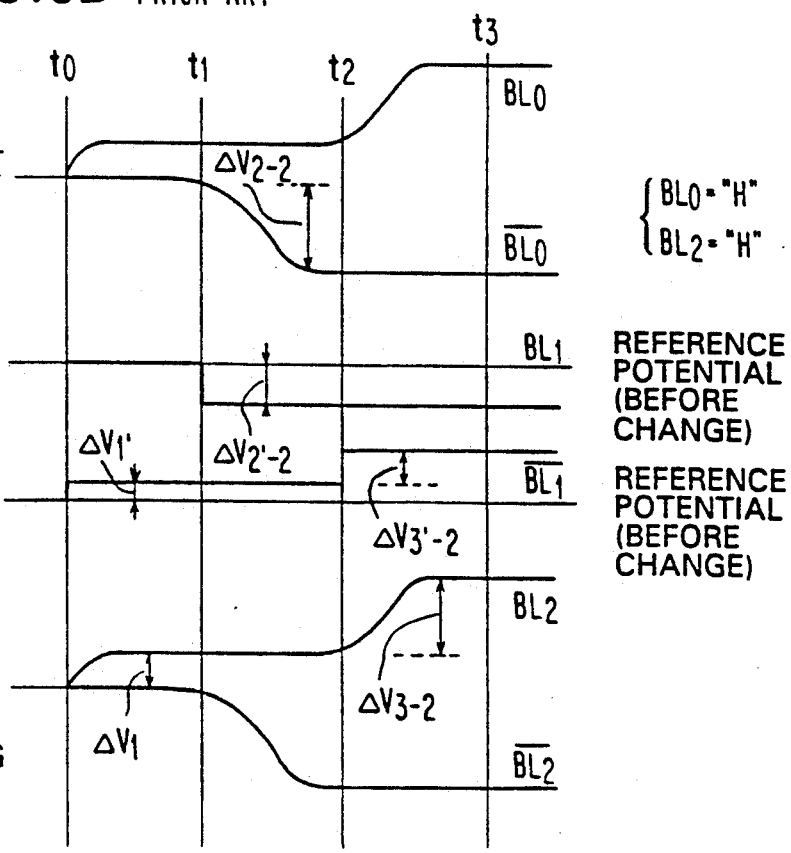

The internal clock signal int.$\overline{RAS}$ is outputted from the clock generator (refer to the reference numeral 80 in FIG. 2) in response to the externally applied control signal $\overline{RAS}$, for prescribing strobing timing of the row addresses and a memory cycle. In response to the fall of the internal clock int.$\overline{RAS}$, the output of the inverter 305 rises to the "H", so that the inverter circuit 300 enters operative. The inputs and outputs of the inverter 301 and the inverter circuit 300 are connected in a ring manner to constitute an inverter latch circuit. On the other hand, when the internal clock signal int.$\overline{RAS}$ is generated, the A10 data (the data at an address pin A10) is applied from the address buffer 2 as an external address signal. The A10 data is latched by the latch circuit comprising the inverter 301 and the inverter circuit 300 of the address buffer 2, and applied to one input of the NOR gate through the inverter 301. The internal clock signal int.$\overline{RAS}$ is applied to the other input of the NOR gate 302. Since the internal clock signal int.$\overline{RAS}$ is at the "L" now, the NOR gate 302 functions as an inverter to invert the output of the inverter 301 for outputting. As a result, the data A10 applied from the address buffer 2 as the most significant internal row address bit RA10 is outputted.

After the fall of the internal clock signal int.$\overline{RAS}$ and establishment of the internal row address bit RA10, the delay time period by the inverters 351–354 has passed, so that the output of the logic gate 354 falls from the "H" down to the "L". As a result, the transistor 320 enters the off-state, thereby cutting off the latch circuit from the address input pin terminal A10. The latch circuit comprising the inverter 301 and the inverter circuit 300 is in an active state during the "L" of the internal clock signal int.$\overline{RAS}$, and latches the applied data and then continuously outputs the latched data. Therefore, the buffer 2 continuously outputs the most significant row address bit RA10 regardless of the most significant column address bit CA10, even if the control signal $\overline{CAS}$ is applied and the most significant column address bit CA10 is externally applied as the data A10.

When one memory cycle ends and the internal clock signal int.$\overline{RAS}$ rises to the "H", the output of the NOR gate 302 falls to the "L". In addition, the output of the fall delaying circuit 350 rises to the "H". The inverter circuit 300 is disabled and an input portion of the inverter 301 is connected to an output portion of the address buffer 2 through the transistor 320.

The above described structure makes it possible to use the most significant row address bit RA10 as a part of column address signals only by switching the connections, even if timing for applying the most significant row address bit RA10 and the column address signals CA0–CA10 is different.

While in the above described embodiments, the description is made of an example in which a memory cell array is divided into 16 blocks and a semiconductor memory device has a memory capacity of 4M bits, it is not necessary for the memory cell array to be divided into the 16 blocks, and the semiconductor memory device may have only one memory cell array. In the semiconductor memory device having the only one memory cell array, the functions of the most significant address bit and the least significant column address bit are simply exchanged.

Furthermore, while in the above described embodiments, the most significant row address bit is used for designating even numbered columns and odd numbered columns in the memory cell array, in this case, it simply depends on the design which bit of the address signals prescribes a column to be selected in a memory cell array, so that any of row address bits can be used as a bit for designating the even numbered columns and odd numbered columns. Therefore, the same effect in the above described embodiments can be obtained by using any of the row address bits as a column address signal for writing and reading information.

In the above described embodiments, the description is made of a structure by which power consumption and peak current can be reduced without increasing the noise from adjacent bit lines in a DRAM sensing operation. However, it is not necessary in particular for twisted bit lines and non-twisted bit lines to be arranged alternately just for reducing only the peak currents in sensing operation. In addition, in this case, neither is necessary in particular to group into even columns and odd columns. One memory array block may be simply divided into two subregions.

Figure 17:
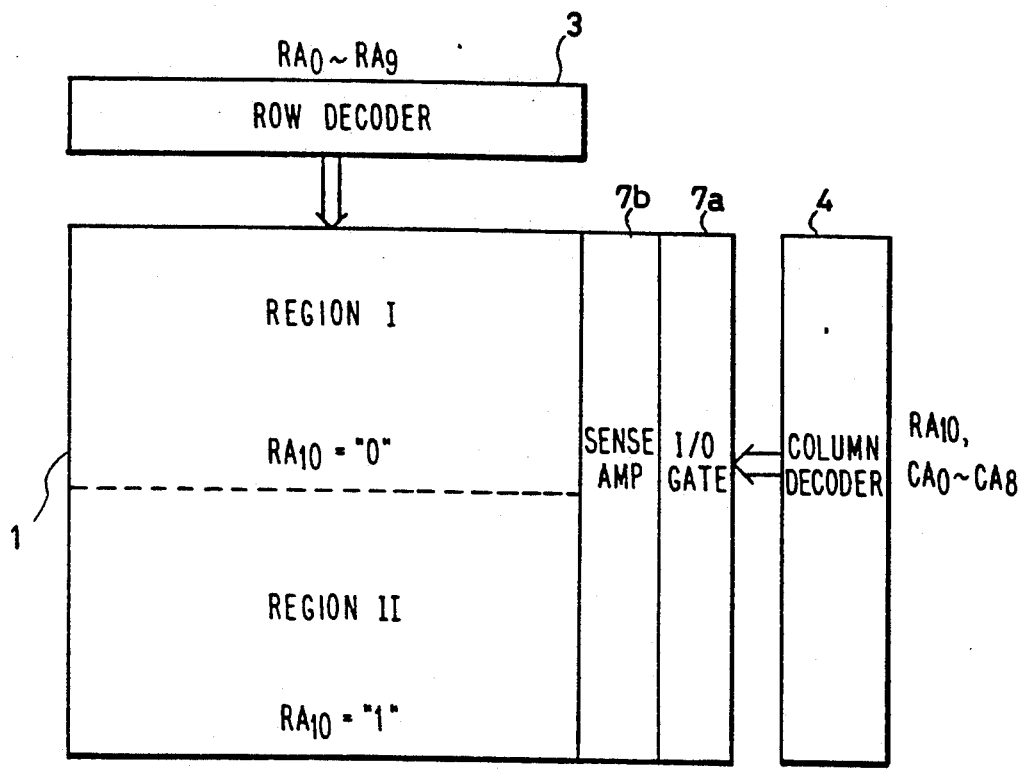
FIG. 17 shows a schematic structure of the memory device according to a further embodiment of the present invention; and, FIG. 18 shows a specific correspondence between address bits and cell array arrangement of the device shown in FIG. 17.

FIG. 17 shows a conceptional structure of a further embodiment of the present invention. In FIG. 17, the memory cell array 1 is grouped into upper half columns and lower half columns by using the most significant row address bit RA10 as a column address bit. A region I is defined by RA10="0" and a region II is defined by RA10="1".

Figure 18:
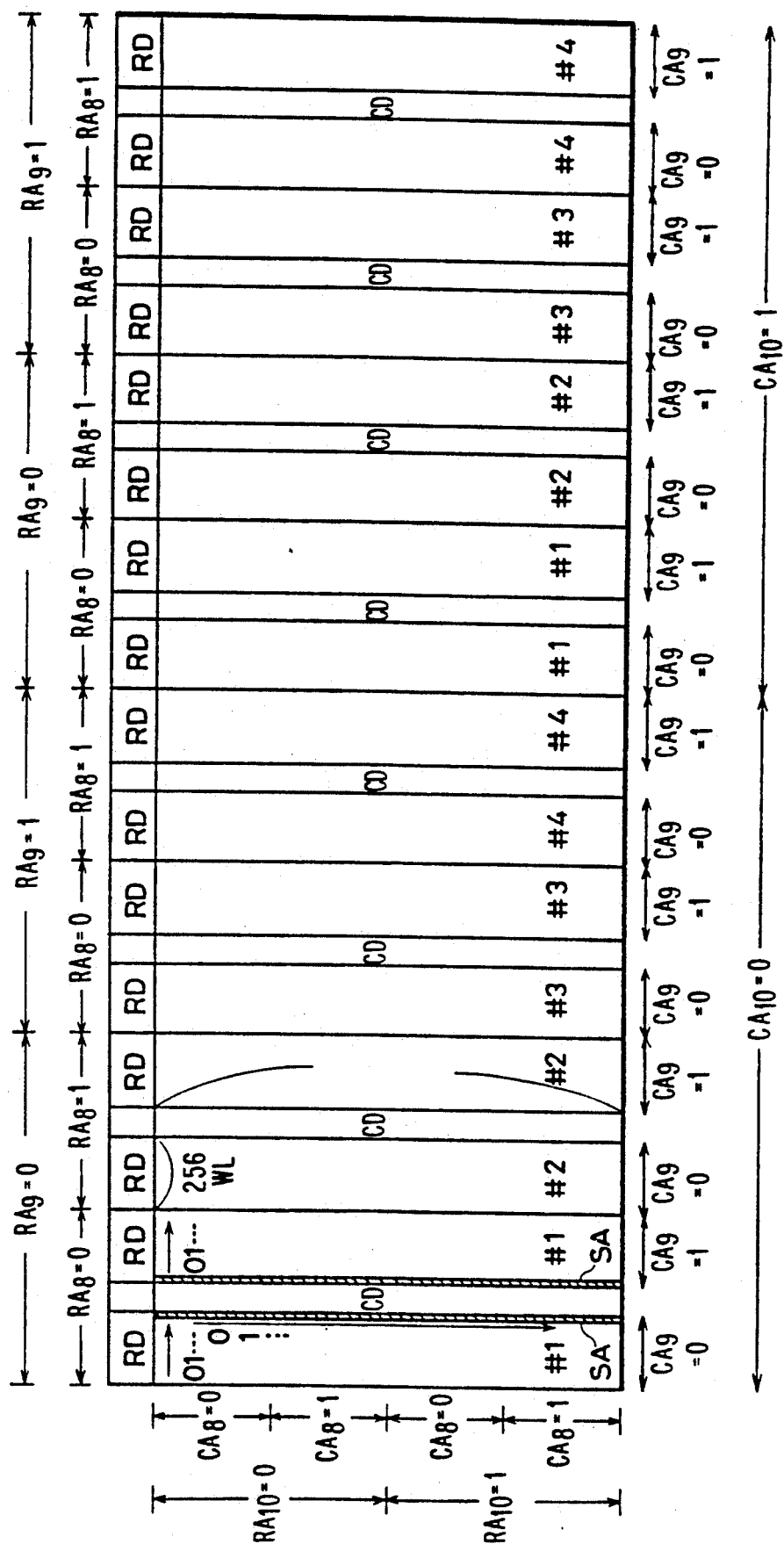

FIG. 18 shows a structure embodied from the conceptional structure of FIG. 17. The memory cell array shown in FIG. 18 has a storage capacity of 4M bit, and comprises 16 submemory arrays similar to that shown in FIGS. 15A and 15B. In FIG. 18, the most significant internal row address bit RA10 is used for designating the upper half columns and the lower half columns, unlike that in FIGS. 15A and 15B.

This structure also makes it possible to implement a shifted activation of sense amplifiers by grouping the columns in the memory cell array to first subject a column group including a selected memory cell to a sensing operation, thereby reducing peak currents. As a result, degradation of the sensitivity of the sense amplifiers caused by the reduced supply potential due to peak currents can be prevented.

While in the above described embodiments, the description is made of the DRAM as a memory device, the present invention can be applied to any memory device as far as the device has the address multiplexing system and sense amplifiers provided in the respective columns.

As in the foregoing, according to the present invention, one memory block is divided into a first column group and a second column group to differentiate starting timing of the sensing operations for the column group including the selected memory cell and the other column group, so that the peak currents in sensing operation can be reduced.

Particularly, in a structure in which timing of sensing operation is different in the first group of bit line pairs having the twisted bit line arrangement and in the second group of bit line pairs having no or, one or more crossing portions, peak current in sensing operation can be dispersed without exerting adverse influence on access time of DRAM and without erroneous sensing operation caused by deviation of a bit line potential by means of capacitive coupling between adjacent bit line pairs, so that malfunction of circuitry of DRAM caused by deviation of a substrate potential derived from peak current in sensing operation can be prevented and current consumption can be reduced drastically.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device for accessing a memory cell, in response to applied address signals for designating the memory cell for data reading or data writing, comprising:

a cell array having a plurality of memory cells arranged in a matrix of rows and columns, said cell array including a first group of columns and a second group of columns;

first sense amplifier means provided for each respective column of said first group of columns for sensing and amplifying signal potentials on associated columns;

second sense amplifier means provided for each respective column of said second group of columns for sensing and amplifying signal potentials on associated columns;

row selection means responsive to a first address signal for selecting a corresponding row in said cell array;

buffer means responsive to a second address signal for generating a column group designating signal and applying said column group designating signal to column selection means, said first and second address signals being simultaneously applied to said semiconductor memory device;

activation means responsive to said column group designating signal for activating said first sense amplifier means and said second sense amplifier means at different timings, said activation means including means for activating first the sense amplifiers provided for the columns included in the column group designated by said column group designating signal; and said column selection means being responsive to said second address signal and a third address signal for selecting a corresponding column in said cell array, said third address signal and said first and second address signals being applied at different timings.

2. A memory device according to claim 1, wherein said first group of columns comprises a plurality of bit line pairs each having at least one twisted portion thereon, and said second group of columns comprises a plurality of bit line pairs having no twisted portions thereon.

3. A semiconductor memory device according to claim 1, wherein said activation means comprises, delay means for delaying a received sense amplifier activating signal by a predetermined time, first means responsive to said column group designating signal for selectively providing one of an output of said delay means and said sense amplifier activating signal to said first sense amplifier means, and second means responsive to said column group designating signal for selectively providing one an output of said delay means and said sense amplifier activating signal to the second sense amplifier means.

4. A semiconductor memory device according to claim 1,
wherein said first sense amplifier means and said second sense amplifier means are arranged in two lines, and said first sense amplifier means are disposed on one line and said second sense amplifier means are disposed on the other line.

5. A memory device according to claim 1 wherein said first group of columns comprises a first plurality of bit line pairs each having at least one twisted portion thereon and said second group of columns comprises a second plurality of bit line pairs, said bit line pairs of said first group and bit line pairs of said second group being alternately arranged.

6. A semiconductor memory device according to claim 5,
wherein said first amplifier means are disposed on one end of said bit line pairs, and said second sense amplifier means are disposed on the opposite end of said bit line pairs.

7. A memory device according to claim 5, wherein said first group of columns comprises a first plurality of bit line pairs each having at least one twisted portion thereon, and said second group of columns comprises a second plurality of bit line pairs having one twisted portion thereon.

8. A memory device according to claim 5, wherein said first group of columns comprises a first plurality of bit line pairs each having at least one twisted portion thereon, and said second group of columns comprises a second plurality of bit line pairs having more than one twisted portion thereon.

9. A semiconductor memory device according to claim 1, wherein said activation means comprises,
first gate means, activated in response to at least said column group designating signal and an activation signal, for passing a sense amplifier activating signal,
delay means for delaying said sense amplifier activating signal by a predetermined time period,
second gate means, activated in response to at least an inverted signal of said column group designating signal and a delayed activation signal, for passing an output of delay means,
third gate means responsive to at least an activating signal from at least either one of said first and second gate means for deriving an activating signal to transfer the same to said first sense amplifier means,
fourth gate means, activated in response to at least the inverted signal of said column group designating signal and said activation signal, for passing the same as a sense amplifier activating signal,
fifth gate means, activated in response to at least said column group designating signal and said delayed activation signal, for passing said output of delay means, and
sixth gate means responsive to at least an activating signal from at least either one of said fourth and fifth gate means for deriving an activating signal to transfer the same to said second sense amplifier means.

10. A semiconductor memory device according to claim 1, wherein said activation means comprises,
first AND gate means activated in response to at least said column group designating signal for passing a sense amplifier activating signal,
delay means for delaying said sense amplifier activating signal by a predetermined time period,
second AND gate means activated in response to at least an inverted signal of said column group designating signal for passing an output of delay means,
first OR gate means responsive to at least an activating signal from at least either one of said first and second gate means for deriving an activating signal to transfer the same to said first sense amplifier means,
fourth AND gate means activated in response to at least the inverted signal of said column group designating signal for passing the same as a sense amplifier activating signal,
fifth AND gate means activated in response to at least said column group designating signal for passing said output of delay means, and
second OR gate means responsive to at least an activating signal from at least either one of said fourth and fifth gate means for deriving an activating signal to transfer the same to said second sense amplifier means.

11. An address multiplexing semiconductor memory device, comprising;
a cell array including a plurality of memory cells arranged in rows and columns;
row selection means responsive to a first address signal for selecting a corresponding row in said cell array, said first address signal being applied to said memory device at a first timing;
buffer means responsive to a second address signal for generating a column group designating signal and applying said column group designating signal to column selection means, said first and second address being simultaneously applied to said semiconductor memory device;
sense amplifier means provided for each respective column of said cell array for sensing and amplifying a signal potential on an associated column;
activation means responsive to said column group designating signal for activating said sense amplifier means,
column selection means responsive to said second address signal and a third address signal for selecting a corresponding column in said cell array, said third address signal being applied at a second timing different from said first timing.

12. In a method of operating a semiconductor memory device comprising a cell array having a plurality of memory cells arranged in a matrix of rows and columns wherein said columns are grouped into a first group of columns and a second group of columns, first sense amplifiers provided for the columns of said first group for sensing and amplifying signal potentials on associated columns and second sense amplifiers provided for the column of said second group for sensing and amplifying signal potentials on associated columns, including row selection means and column selection means a method of driving the sense amplifiers comprising the steps of:
applying first and second address signals simultaneously to said semiconductor memory device;
generating a column group designating signal, in response to said second address signal;
applying said column group designating signal to said column selection means;
activating, in response to said column group designating signal, said first sense amplifiers and said second sense amplifiers at different timings;

wherein sense amplifiers provided for the columns corresponding to a column group designated by said column group designating are first activated, said row selection means are responsive to said first address signal applied to said semiconductor memory device to designate a row in said cell array at a first timing, and said second address signal constitutes a column address signal for designating a column in said cell array when combined with a third address signal applied at a second timing different from said first timing.

13. A method according to claim 12, wherein said activating step comprises the steps of:

delaying a sense amplifier activating signal, passing either one of said sense amplifier activating signal and said delayed sense amplifier activating signal in response to said column group designating signal, for transferring the same to said first sense amplifiers, and passing either one of said sense amplifier activating signal and said delayed sense amplifier activating signal in response to said column group designating signal, for transferring the same to said second sense amplifiers, wherein when said sense amplifier activating signal is transferred to sense amplifiers of one of the groups, said delayed sense amplifier activating signal is transferred to sense amplifiers of the other group.

14. In a method of operating a semiconductor memory device including a cell array having a plurality of memory cells arranged in a matrix of rows and columns wherein said columns comprise a first group of bit line pairs each having at least one crossing portion therein and a second group of bit line pairs each having no crossing therein, first sense amplifiers provided for the bit line pairs of said first group for sensing and amplifying signal potentials on associated bit line pairs, and second sense amplifier provided for the columns of said second group for sensing and amplifying signal potentials on associated bit line pairs, and wherein said bit line pairs of said first group and bit line pairs of said second group are arranged alternately in said cell array including row selection means and column selection means, a method of driving the sense amplifiers comprising the steps of:

applying first and second address signals simultaneously to said semiconductor memory device;

generating a column group designating signal, in response to said second address signal, applying said column group designating signal to said column selection means;

activating, in response to said group designating signal, said first sense amplifiers and said second sense amplifier at different timings;

wherein sense amplifiers corresponding to a column group provided for the bit line pairs designated by said group designating signal are first activated, said row selection means are responsive to said first address signal applied to said semiconductor memory device at a first timing to designate a row in said cell array, and said second address signal constitutes a column address signal for designating a column in said cell array when combined with a third address signal applied thereto at a second timing different from said first timing.

15. A method according to claim 14, wherein said activating step comprises the steps of:

delaying a sense amplifier activating signal, passing either one of said sense amplifier activating signal and said delayed sense amplifier activating signal in response to said group designating signal, for transferring the same to said first sense amplifiers, and passing either one of said sense amplifier activating signal and said delayed sense amplifier activating signal in response to said group designating signal, for transferring the same to said second sense amplifiers, wherein when said sense amplifier activating signal is transferred to sense amplifiers of one of the groups, said delayed sense amplifier activating signal is transferred to sense amplifiers of the other group.

16. A method for operating a semiconductor memory device comprising a cell array including a plurality of memory cells arranged in rows and columns including column selection means, comprising the steps of:

receiving a first address signal for generating a row designating signal for designating a row in said cell array;

receiving a second address signal simultaneously with said first address signal;

generating a column group designating signal in response to said second address signal;

applying said column group designating signal to said column selection means;

receiving a third address signal at a timing different from that of said first and second address signals to combine said third address signal with said second address signal to generate a column designating signal designating a column in said cell array; and activating sense amplifiers in a column group designated by said column group designating signal before activating sense amplifiers in column groups not designated by said column group designating signal.

* * * * *